(12) United States Patent
Shimizu

(10) Patent No.: US 9,496,365 B2
(45) Date of Patent: Nov. 15, 2016

(54) SEMICONDUCTOR DEVICE AND MANUFACTURING METHOD FOR THE SAME

(71) Applicant: Kabushiki Kaisha Toshiba, Minato-ku (JP)

(72) Inventor: Tatsuo Shimizu, Shinagawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/458,611

(22) Filed: Aug. 13, 2014

(65) Prior Publication Data

US 2015/0084068 A1    Mar. 26, 2015

(30) Foreign Application Priority Data

Sep. 20, 2013 (JP) ................................. 2013-196230

(51) Int. Cl.
*H01L 21/02* (2006.01)
*H01L 21/04* (2006.01)
(Continued)

(52) U.S. Cl.
CPC ....... *H01L 29/518* (2013.01); *H01L 21/02142* (2013.01); *H01L 21/02145* (2013.01); *H01L 21/02156* (2013.01); *H01L 21/02161* (2013.01); *H01L 21/045* (2013.01); *H01L 21/049* (2013.01); *H01L 21/28229* (2013.01); *H01L 21/28255* (2013.01); *H01L 29/1608* (2013.01); *H01L 29/511* (2013.01); *H01L 29/517* (2013.01); *H01L 29/66068* (2013.01); *H01L 29/66477* (2013.01); *H01L 29/78* (2013.01); *H01L 29/7802* (2013.01); *H01L 29/78684* (2013.01); *H01L 21/32105* (2013.01)

(58) Field of Classification Search
None
See application file for complete search history.

(56) References Cited

U.S. PATENT DOCUMENTS

2003/0227061 A1* 12/2003 Yokogawa ............ H01L 29/105
257/379
2005/0017272 A1*  1/2005 Yamashita ............ H01L 21/049
257/288

(Continued)

FOREIGN PATENT DOCUMENTS

JP        2010-27962         2/2010
JP        2011-146426 A  *  7/2011

(Continued)

OTHER PUBLICATIONS

Machine translation of JP 2011-146426 A.*

(Continued)

*Primary Examiner* — Erik Kielin
(74) *Attorney, Agent, or Firm* — Oblon, McClelland, Maier & Neustadt, L.L.P

(57) ABSTRACT

A semiconductor device of an embodiment includes: an SiC layer; a gate insulating film provided on a surface of the SiC layer, the gate insulating film including an oxide film or an oxynitride film in contact with the surface of the SiC layer, the oxide film or the oxynitride film containing at least one element selected from B, Al, Ga (gallium), In, Sc, Y, La, Mg, Ca, Sr, and Ba, a concentration peak of the element in the gate insulating film being on the SiC side of the gate insulating film, the concentration peak of the element being in the oxide film or the oxynitride film, the gate insulating film having a region with a concentration of the element being not higher than $1 \times 10^{16}$ cm$^{-3}$ on the opposite side to the SiC layer with the concentration peak; and a gate electrode on the gate insulating film.

14 Claims, 15 Drawing Sheets

(51) Int. Cl.
*H01L 21/28* (2006.01)
*H01L 29/51* (2006.01)
*H01L 29/78* (2006.01)
*H01L 29/786* (2006.01)
*H01L 29/66* (2006.01)
*H01L 29/16* (2006.01)
*H01L 21/321* (2006.01)

(56) References Cited

U.S. PATENT DOCUMENTS

| | | |
|---|---|---|
| 2005/0077569 A1 | 4/2005 | Yamashita et al. |
| 2006/0194379 A1 | 8/2006 | Suda et al. |
| 2010/0155854 A1* | 6/2010 | Stahrenberg et al. ........ 257/392 |
| 2011/0049530 A1 | 3/2011 | Dhar et al. |
| 2012/0056195 A1* | 3/2012 | Kono et al. ................ 257/77 |
| 2012/0199846 A1 | 8/2012 | Shimizu et al. |
| 2012/0326163 A1 | 12/2012 | Dhar et al. |
| 2012/0329216 A1 | 12/2012 | Dhar et al. |
| 2013/0099328 A1* | 4/2013 | Xu et al. .................. 257/411 |
| 2014/0084303 A1 | 3/2014 | Shimizu et al. |
| 2014/0264382 A1* | 9/2014 | MacMillan ......... H01L 29/1608 257/77 |

FOREIGN PATENT DOCUMENTS

| | | |
|---|---|---|
| JP | 2013-502739 | 1/2013 |
| JP | 2012-177255 A * | 9/2013 |
| WO | WO 2005/010974 A1 | 2/2005 |

OTHER PUBLICATIONS

Heiji Watanabe, et al., "Energy Band Structure of $SiO_2$/4H-SiC Interfaces and its Modulation Induced by Intrinsic and Extrinsic Interface Charge Transfer", Materials Science Forum, vols. 679-680, 2011, 4 pages.

Extended European Search Report issued Feb. 5, 2015 in Patent Application No. 14180108.4.

Takuji Hosoi, et al., "Performance and Reliability Improvement in SiC Power MOSFETs by Implementing AlON High-κ Gate Dielectrics" 2012 International Electron Devices Meeting (IEDM 2012), XP032341690, 2012, pp. 7.4.1-7.4.4.

Rahul Suri, et al., "Energy-band alignment of $Al_2O_3$ and HfAlO gate dielectrics deposited by atomic layer deposition on 4H-SiC" Applied Physics Letters, vol. 96, XP012131925, 2010, pp. 042903-1-042903-3.

* cited by examiner

SECOND ADJACENT OXYGEN
REPLACEMENT STRUCTURE

FIRST ADJACENT OXYGEN
REPLACEMENT STRUCTURE

SEMICONDUCTOR DEVICE AND MANUFACTURING METHOD FOR THE SAME

CROSS-REFERENCE TO RELATED APPLICATION

This application is based upon and claims the benefit of priority from Japanese Patent Application No. 2013-196230, filed on Sep. 20, 2013, the entire contents of which are incorporated herein by reference.

FIELD

Embodiments described herein relate generally to a semiconductor device and a manufacturing method for the semiconductor device.

BACKGROUND

SiC (silicon carbide) is expected to be a material for next-generation power semiconductor devices. SIC has excellent physical properties, having a band gap three times wider than that of Si (silicon), a breakdown field strength about 10 times higher than that of Si, and a heat conductivity about three times higher than that of Si. By taking advantage of those properties, it is possible to realize a power semiconductor device that is low-loss and capable of high-temperature operation.

Meanwhile, it is known that, when a MOS (Metal Oxide Semiconductor) structure is formed on the C-plane of 4H—SiC, a gate leakage current becomes larger as compared to the Si-plane.

DETAILED DESCRIPTION

Figure 1:
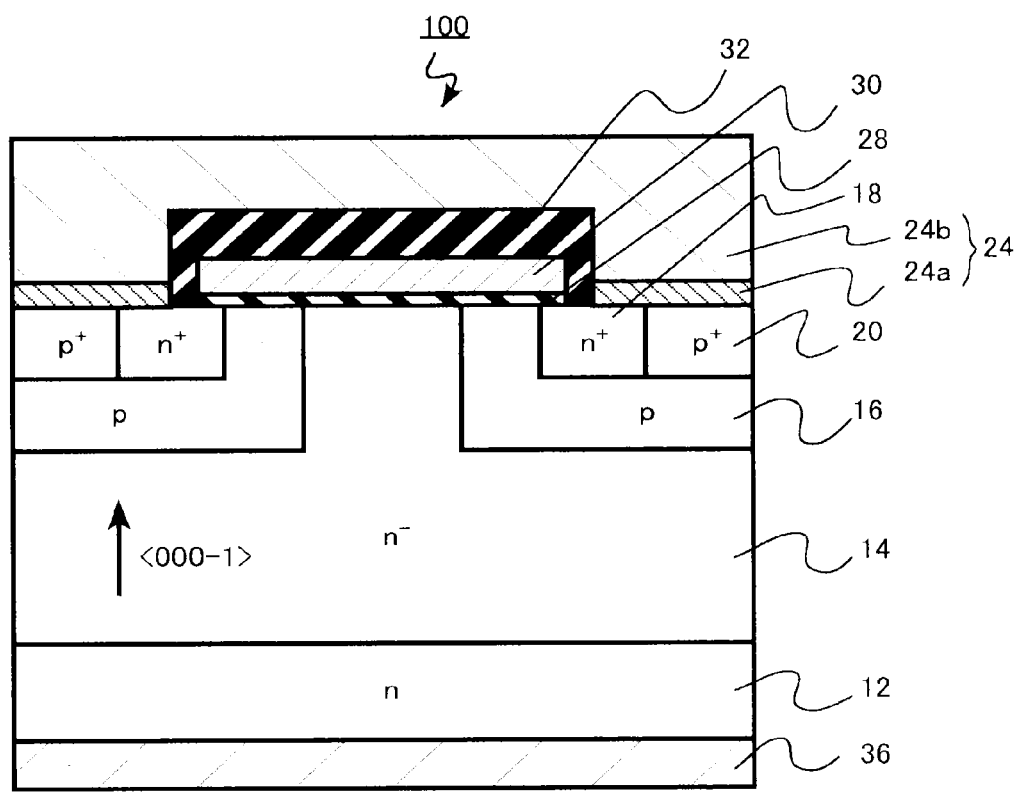
FIG. 1 is a schematic cross-sectional view showing a semiconductor device of a first embodiment.

A semiconductor device of an embodiment is a semiconductor device including: an SiC layer; a gate insulating film provided on a surface of the SiC layer, the gate insulating film including an oxide film or an oxynitride film in contact with the surface of the SiC layer, the oxide film or the oxynitride film containing at least one element selected from B (boron), Al (aluminum), Ga (gallium), In (indium), Sc (scandium), Y (yttrium), La (lantern), Mg (magnesium), Ca (calcium), Sr (strontium), and Ba (barium), a concentration peak of the element in the gate insulating film being on the SiC layer side of the gate insulating film, the concentration peak of the element being in the oxide film or the oxynitride film, the gate insulating film having a region with a concentration of the element being not higher than $1\times10^{16}$ cm$^{-3}$ on the opposite side to the SiC layer with the concentration peak of the element; and a gate electrode provided on the gate insulating film.

Hereinafter, embodiments will be described with reference to the drawings. It is to be noted that in the following description, the same component is denoted by the same reference numeral, and a description of the once described component or the like will not be repeated as appropriate.

Further, in the following description, n$^+$, n, n$^-$, p$^+$, p, and p$^-$ indicate relative levels of impurity concentrations in the respective conductive types. That is, n$^+$ indicates that an n-type impurity concentration is relatively higher than that of n, and n$^-$ indicates that an n-type impurity concentration is relatively lower than that of n. Further, p$^+$ indicates that a p-type impurity concentration is relatively higher than that of p, and p$^-$ indicates that a p-type impurity concentration is relatively lower than that of p. In addition, an n$^+$ type and an n$^-$ type may be simply referred to as an n-type, and a p$^+$ type and a p$^-$ type may be simply referred to as a p-type.

(First Embodiment)

A semiconductor device of the present embodiment is a semiconductor device includes: an SiC layer; a gate insulating film provided on a surface of the SiC layer, the gate insulating film including an oxide film or an oxynitride film in contact with the surface of the SiC layer, the oxide film or the oxynitride film containing at least one element selected from B (boron), Al (aluminum), Ga (gallium), In (indium), Sc (scandium), Y (yttrium), La (lantern), Mg (magnesium), Ca (calcium), Sr (strontium), and Ba (barium), a concentration peak of the element in the gate insulating film being on the SiC layer side of the gate insulating film, the concentration peak of the element being in the oxide film or the oxynitride film, the gate insulating film having a region with a concentration of the element being not higher than $1\times10^{-6}$ cm$^{-3}$, the opposite side to the SiC layer with the concentration peak; and a gate electrode provided on the gate insulating film.

It is especially a semiconductor device including: an SiC substrate having first and second planes; a first conductive type SiC layer formed on the first plane side of the SiC substrate; a second conductive type first SiC region provided on a surface of the SiC layer; a first conductive type second SiC region provided on a surface of the first SiC region; a gate insulating film provided continuously to the surfaces of the SiC layer and the first SiC region, the gate insulating film including an oxide film or an oxynitride film in contact with the surface of the first SiC layer, the oxide film or the oxynitride film containing at least one element selected from B (boron), Al (aluminum), Ga (gallium), In (indium), Sc (scandium), Y (yttrium), La (lantern), Mg (magnesium), Ca (calcium), Sr (strontium), and Ba (barium), a concentration peak of the element in the gate insulating film being on the first SiC region side of the gate insulating film, the concentration peak of the element being in the oxide film or the oxynitride film, the gate insulating film having a region with a concentration of the element of not higher than $1 \times 10^{16}$ cm$^{-3}$ on the opposite side to the SiC layer with the concentration peak; a gate electrode formed on the gate insulating film; a first electrode formed on the second SiC region; and a second electrode formed on the second plane side of the SiC substrate.

FIG. 1 is a schematic cross-sectional view showing a configuration of a MOSFET as a semiconductor device of the present embodiment. This MOSFET (Metal Oxide Semiconductor Field Effect Transistor) 100 is a Double Implantation MOSFET (DIMOSFET) having a p-well region and a source region formed by ion implantation.

The MOSFET 100 is an n-type transistor with electrons being carriers. Further, the MOSFET 100 is a vertical transistor where carriers are moved between a source electrode on the surface side of a semiconductor substrate and a drain electrode on the rear surface side of the same.

This MOSFET 100 includes an SiC substrate (silicon carbide substrate) 12 provided with first and second planes. In FIG. 1, the first plane is the plane on the upper side of the drawing, and the second plane is the plane on the lower side of the drawing. This SiC substrate 12 is an SiC substrate (n-substrate) of 4H—SiC that contains N (nitrogen), for example, as an n-type impurity at an impurity concentration of not lower than $1 \times 10^{16}$ cm$^{-3}$ and not higher than $1 \times 10^{19}$ cm$^{-3}$, for example.

The first plane is the C-plane, namely the (000-1) plane. The first plane may be offset in a range of not larger than 8 degrees, for example, with respect to the C-plane.

The first plane of this SiC substrate 12 is formed with an n-type SiC layer (n$^-$-SiC layer) 14 that contains the n-type impurity at an impurity concentration of not lower than $5 \times 10^{15}$ cm$^{-3}$ and not higher than $2 \times 10^{16}$ cm$^{-3}$, for example. A film thickness of the n$^-$-SiC layer 14 is approximately 5 to 20 µm, for example.

Part of the surface of the n$^-$-SiC layer 14 is formed with a p-type first SiC region (p-well region) 16 containing the p-type impurity at an impurity concentration of not lower than $5 \times 10^{15}$ cm$^{-3}$ and not higher than $1 \times 10^{17}$ cm$^{-3}$, for example. A depth of the p-well region 16 is approximately 0.6 µm, for example. The p-well region 16 functions as a channel region of the MOSFET 10C.

Part of the surface of the first SiC region (p-well region) 16 is formed with an n$^+$-type second SiC region (source region) 18 that contains the n-type impurity at an impurity concentration of not lower than $1 \times 10^{18}$ cm$^{-3}$ and not higher than $1 \times 10^{22}$ cm$^{-3}$, for example. A depth of the source region 18 is smaller than the depth of the first SiC region (p-well region) 16, and is approximately 0.3 µm, for example.

Further, part of the surface of the first SiC region (p-well region) 16 and the side of the n$^+$-type second SiC region (source region) 18 are formed with a p$^+$-type third SiC region (p-well contact region) 20 that contains the p-type impurity at an impurity concentration of not lower than $1 \times 10^{18}$ cm$^{-3}$ and not higher than $1 \times 10^{22}$ cm$^{-3}$, for example. A depth of the p-well contact region 20 is smaller than the depth of the first SiC region (p-well region) 16, and is approximately 0.3 µm, for example.

A gate insulating film 28 is continuously formed on the surfaces of the n$^-$-SiC layer 14 and the first SiC region (p-well region) 16, so as to bridge the layer and the region. A gate electrode 30 is formed on the gate insulating film 28. The gate electrode 30 can be applied with polysilicon or the like, for example.

Figure 2A:
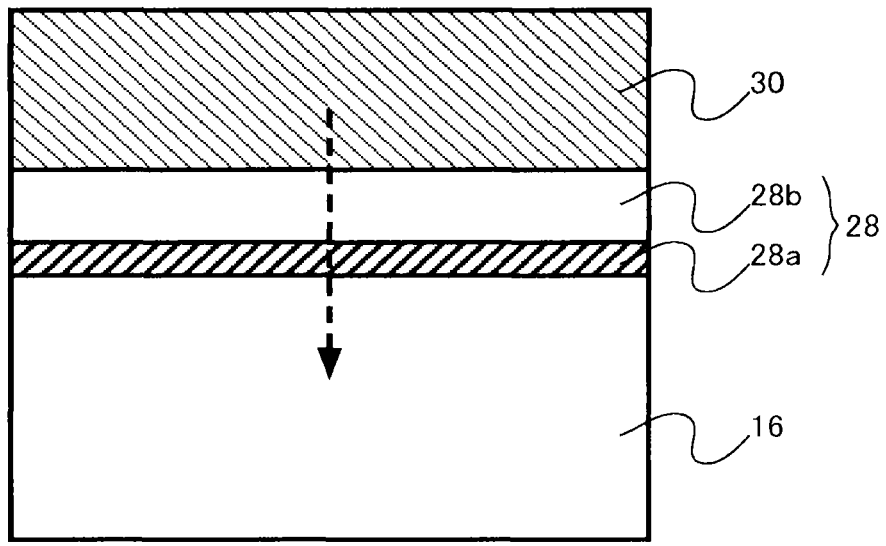
FIG. 2A is an enlarged view of a gate insulating film portion and a gate electrode portion of the first embodiment.
Figure 2B:
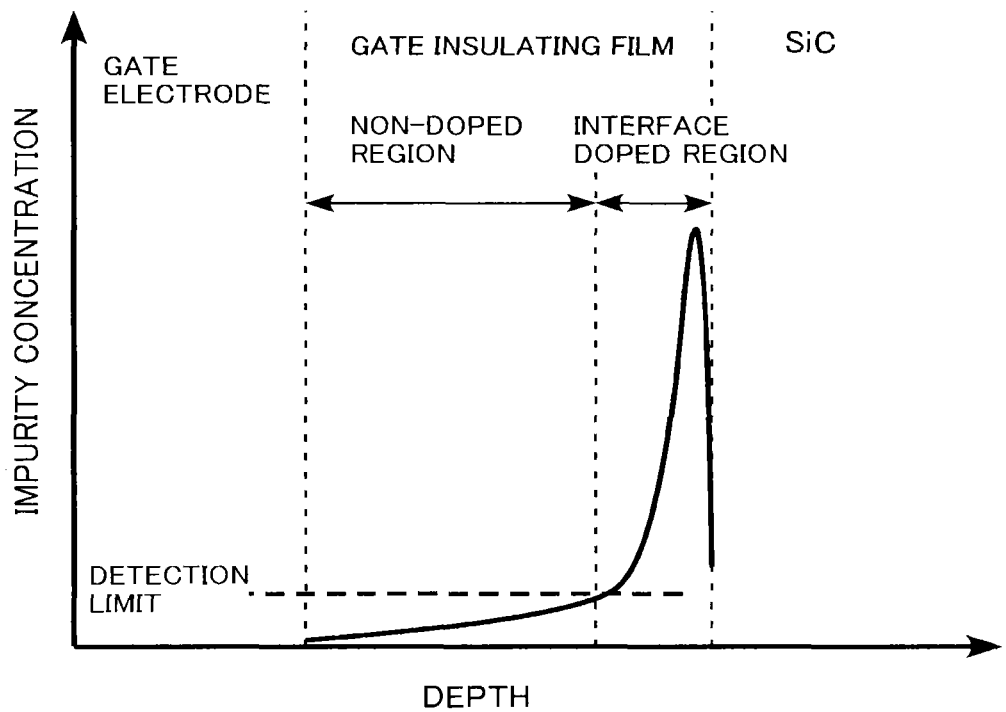
FIG. 2B is a diagram showing an element distribution of a gate insulating film portion and a gate electrode portion of the first embodiment.

FIG. 2A is an enlarged view of the gate insulating film portion and a gate electrode portion of the present embodiment, and FIG. 2B is a diagram showing an element distribution of the gate insulating film portion and a gate electrode portion of the present embodiment. FIG. 2A is an enlarged view of the gate insulating film 28 portion and the gate electrode 30 portion, and FIG. 2B is a diagram showing an element distribution.

The gate insulating film 28 includes an oxide film or an oxynitride film in contact with the surface of the first SiC region 16, and the oxide film or the oxynitride film contains at least one element selected from B (boron), Al (aluminum), Ga (gallium), In (indium), Sc (scandium), Y (yttrium), La (lantern), Mg (magnesium), Ca (calcium), Sr (strontium), and Ba (barium). A concentration peak of the element in the gate insulating film 28 is on the first SiC region 16 side of the gate insulating film 28, and the concentration peak of the element is in the oxide film or the oxynitride film.

Hereinafter, there will be described a case as an example where the element is B (boron), the oxide film or the oxynitride film is a silicon oxide film, and the entire gate insulating film 28 is also a silicon oxide film.

As shown in FIG. 2A, the gate insulating film 28 is configured of an interface doped region 28a which is in contact with the surface of SiC, namely the surface of the first SiC region 16, and has a high concentration of B, and an non-doped region 28b which is not doped with B on the gate electrode 30 side. Here, in the non-doped region 28b which is not doped, the concentration of B is not higher than a detection limit in a variety of physical analyses (SIMS, atom probing, XPS, etc.). Hence in the concentration distribution of B in the gate insulating film 28, a concentration peak of B exists on the first SiC region 16 side in the gate insulating film 28, as shown in FIG. 2B. Further, the gate insulating film 28 has a region with the concentration of B of not higher than $1 \times 10^{16}$ cm$^{-3}$ on the opposite side to the first SiC region (SiC layer) 16 with the concentration peak of B.

For example, in the case of diffusing B or the like from the gate electrode side or the case of introducing B throughout the insulating film, it is difficult to form an insulating film configured to have the non-doped region 28b and the interface doped region 28a. Obtaining the insulating film with this configuration requires devising some ways to form the film, such as laminating a film doped with B and a film not doped with B, as shown later.

An interlayer insulating film 32 that is formed of an SiO$_2$ film, for example, is formed on the gate electrode 30. The first SiC region 16 interposed between the second SiC region (source region) 18 below the gate electrode and the n⁻-SiC layer 14 functions as the channel region of the MOSFET 100.

A conductive first electrode (source/p-well common electrode) 24 electrically connected to the second SiC region (source region) 18 and the third SiC region (p-well contact region) 20 is then provided. The first electrode (source/p-well common electrode) 24 is configured of an Ni (nickel) barrier metal layer 24a and an Al metal layer 24b formed on the barrier metal layer 24a, for example. The Ni barrier metal layer 24a and the Al metal layer 24b may form an alloy through a reaction.

Further, a conductive second electrode (drain electrode) 36 is formed on the second plane side of the SiC substrate 12. The second electrode (drain electrode) 36 is made of Ni, for example.

It is to be noted that in the present embodiment, the n-type impurity is preferably N (nitrogen) or P (phosphorus), for example, but it is possible to apply As (arsenic) or the like. Also, the p-type impurity is preferably Al (aluminum), for example, but it is possible to apply B (boron), Ga (gallium), In (indium), or the like.

Hereinafter, the function and effect of the present embodiment will be described in detail. FIGS. 3 to 8 are explanatory diagrams of the function and effect of the present embodiment.

Figure 3:
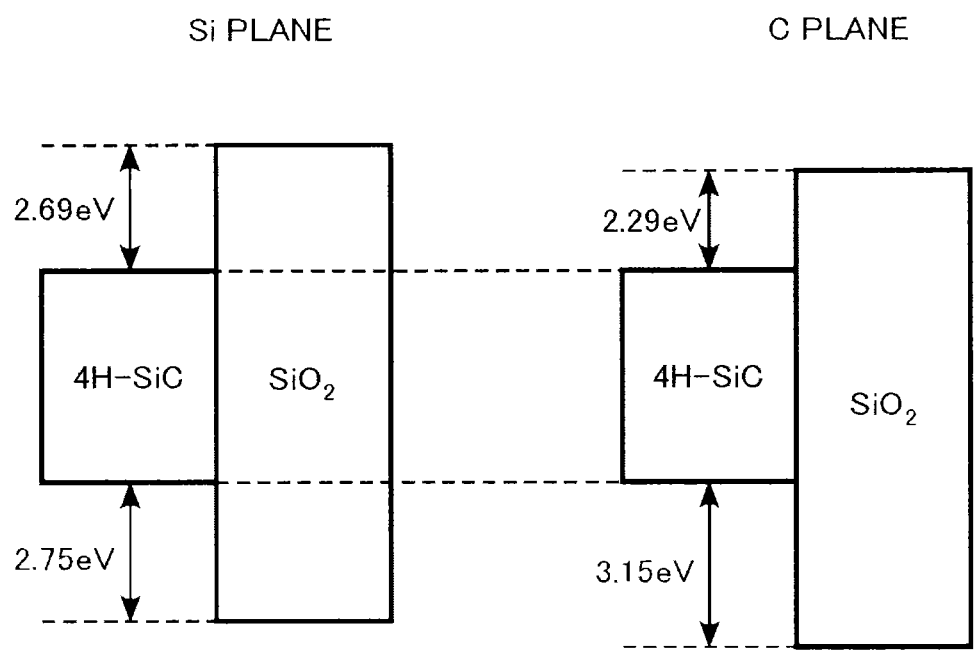
FIG. 3 is an explanatory diagram of an function and an effect of the first embodiment.

FIG. 3 is a diagram showing a band structure of SiC and the gate insulating film 28 of $SiO_2$ formed on SiC. The left drawing shows the case of the Si (silicon)-plane of 4H—SiC, namely the (0001) plane. The right drawing shows the case of the C (carbon)-plane of 4H—SiC, namely the (000-1) plane.

As shown in the drawing, when the Si-plane and the C-plane are compared, a difference in energy at the lower end of a conduction band between SiC and $SiO_2$ (hereinafter also referred to as band offset ($\Delta Ec$)) is that the energy is approximately 0.4 eV to 0.6 eV smaller on the C-plane. For this reason, when the gate insulating film 28 and the gate electrode 30 are formed on SiC, there occurs a problem of a gate leakage current becoming larger on the C-plane.

On the other hand, the carrier mobility is higher on the C-plane than on the Si-plane.

The inventors conducted studies by means of a first principle calculation in order to clarify the differences in band offset and mobility between the Si-plane and the C-plane. Based on a result of the studies, the function and effect of the present embodiment will be described in detail below.

In the vicinity of an $SiC/SiO_2$ interface, a C (carbon) defect occurs on the SiC side due to oxidation at the time of forming the gate insulating film 28. In the vicinity of the surface of SiC, generating energy of C-defect is low. Accordingly, when there is atomic oxygen, CO is easily formed and released.

Further, during a process in which the vicinity of the surface of SiC is oxidized, carbon atoms are released. At this time, with a bond (C—C bond) between carbon atoms being strong, a $C_2$ dimer structure is formed on the $SiO_2$ side. This $C_2$ dimer structure is a structure formed by replacing O (oxygen) of $SiO_2$ with C (carbon). Hereinafter, the $C_2$ dimer structure is referred to as a CoCo structure.

Figure 4A:
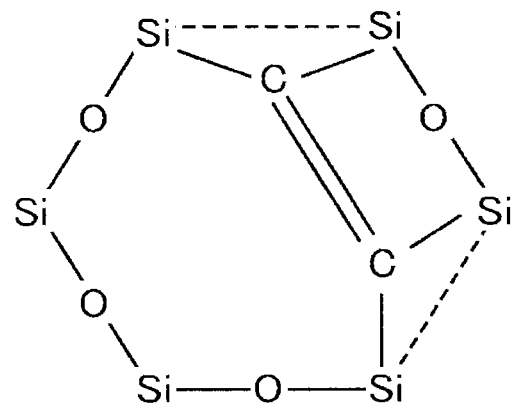
FIGS. 4A and 4B are explanatory diagrams of the function and effect of the first embodiment.
Figure 4B:
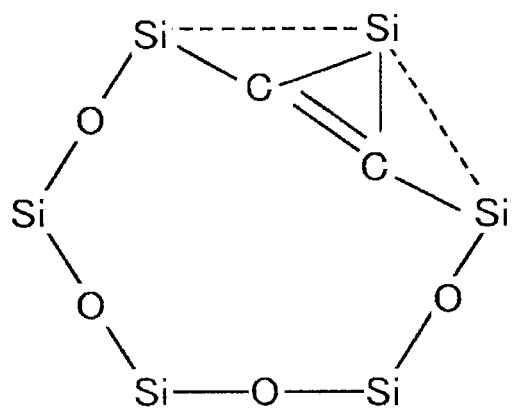

FIGS. 4A and 4B are explanatory diagrams of the CoCo structure. FIG. 4A is a second adjacent oxygen replacement structure, and FIG. 4B is a first adjacent oxygen replacement structure.

There are some variations in the CoCo structure. According to the first principle calculation, in a hexagonal structure formed by an Si—O—Si bonds, a structure (hereinafter referred to as second adjacent oxygen replacement structure) where a second adjacent oxygen is replaced with carbon and C is connected to a remaining bond of Si as shown in FIG. 4A has been most stable. At this time, carbons each have a structure of being bonded with Si in place of a hydrogen atom of ethylene ($H_2C$—$CH_2$). This structure has emerged so as to allow C to stably take a 3-coordination geometry, and it does not emerge with Si.

Figure 5A:
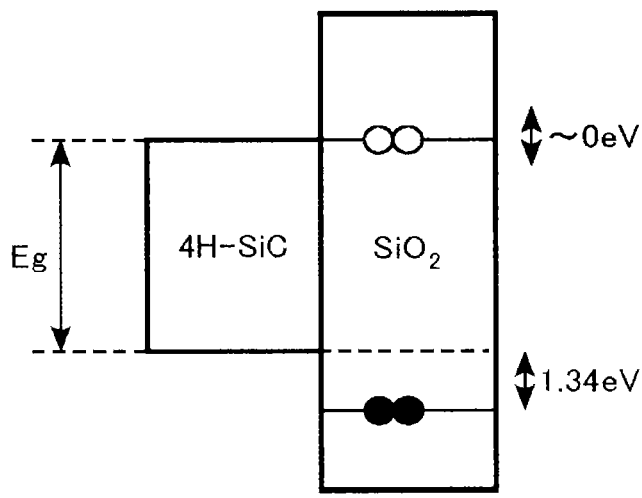
FIGS. 5A and 5B are explanatory diagrams of the function and effect of the first embodiment.
Figure 5B:
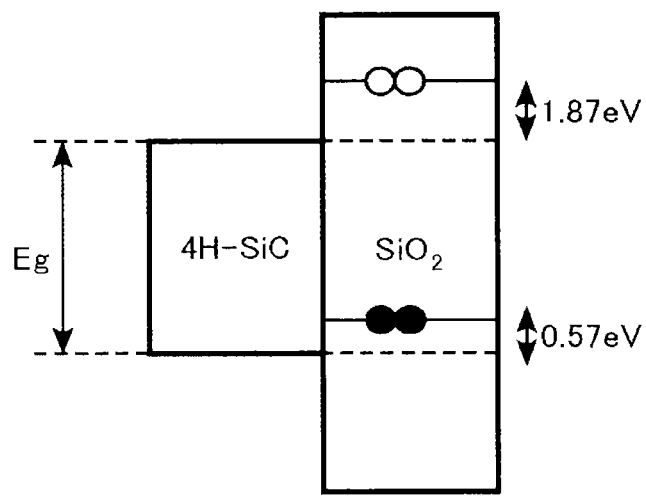

FIGS. 5A and 5B are explanatory diagrams of a state of electrons in the CoCo structure. FIG. 5A is a diagram of the second adjacent oxygen replacement structure, and FIG. 5B is a diagram of in the first adjacent oxygen replacement structure.

As for the state of electrons in the second adjacent oxygen replacement structure, there exist one electron-empty state and one electron-filled state in a band gap. The electron-empty state is in a position at the lower end of a conduction band of 4H—SiC, and this state is thought to bring about the mobility degradation. That is, electrons that move in the channel are trapped in the empty state, to cause the mobility degradation.

On the other hand, the electron-filled state is deeper than the upper end of a valance band, and does not have a large influence. On the Si-plane, this second adjacent oxygen replacement structure is principally formed, thus leading to large carrier mobility degradation.

The second most stable structure among the CoCo structures has been a structure (referred to as first adjacent oxygen replacement structure) where a first adjacent oxygen is replaced with carbon and C is connected to a remaining bond of Si, as shown in FIG. 4B. As shown in FIG. 55, as for the state of electrons in the first adjacent oxygen replacement structure, the electron-empty state is approximately 1.9 eV over the lower end of the conduction band of 4H—SiC. This state does not bring about the mobility degradation. On the other hand, the electron filled state is approximately 0.6 eV over VB of 4H—SiC.

Figure 6:
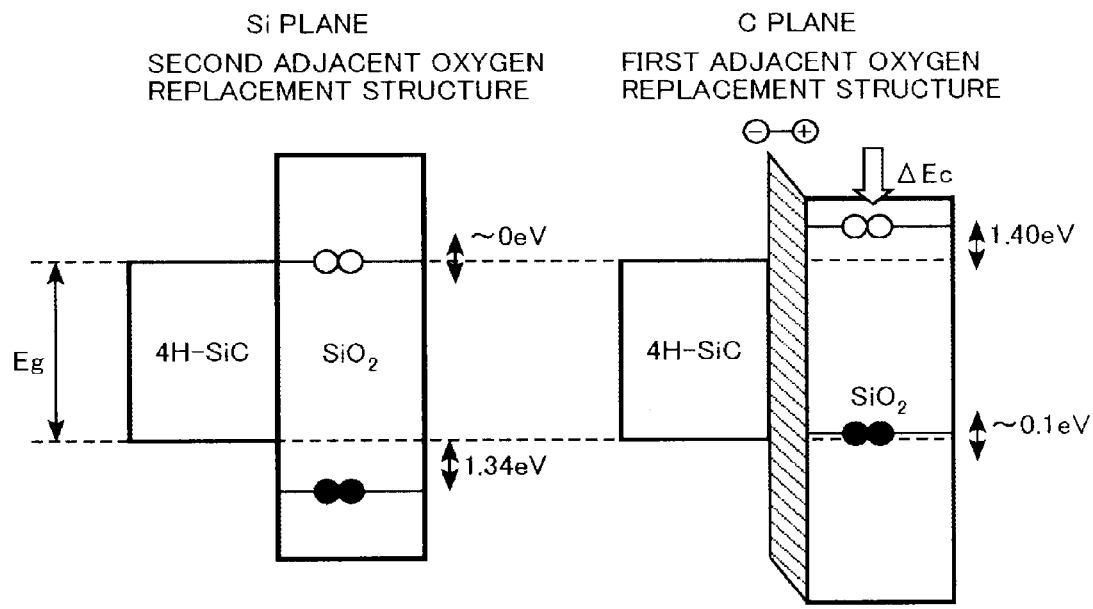
FIG. 6 is an explanatory diagram of the function and effect of the first embodiment.

FIG. 6 is a diagram showing a CoCo structure on the Si-plane and the C-plane. On the C-plane, the interface state exists at the upper end of the valence band of 4H—SiC. For this reason, in the first adjacent oxygen replacement structure, electrons can be taken in the interface state of the C-plane. Therefore, electrons are taken out of the first adjacent oxygen replacement structure in the $SiO_2$ film, to make the entire system stable. With this stabilization, conversion occurs on the C-plane from the second adjacent oxygen replacement structure to the first adjacent oxygen replacement structure. Hence the first adjacent oxygen replacement structure is principally formed in the vicinity of the interface of the C-plane.

At this time, as shown in the right diagram of FIG. 6, on the $SiC/SiO_2$ interface, there occurs a fixed dipole in a direction of pulling down $\Delta Ec$ on the $SiC/SiO_2$ interface. Accordingly, $\Delta Ec$ on the C-plane decreases by 0.4 to 0.6 eV as compared to that on the Si-plane. Further, since the first adjacent oxygen replacement structure is principally formed and a ratio of the second adjacent oxygen replacement structure is low, the mobility degradation on the C-plane becomes smaller as compared to that on the Si-plane.

As thus described, in comparison between the Si-plane and the C-plane, the second adjacent oxygen replacement structure is more stable on the Si-plane, and the first adjacent oxygen replacement structure is more stable on the C-plane. Accordingly, the mobility is relatively small and $\Delta Ec$ is relatively large on the Si-plane. In other words, the mobility is large, but $\Delta Ec$ is small, on the C-plane.

In the present embodiment, the interface doped region 28a in contact with SiC in the gate insulating film 28 contains at least one element selected from B (boron), Al (aluminum), Ga (gallium), In (indium), Sc (scandium), Y (yttrium), La (lantern), Mg (magnesium), Ca (calcium), Sr (strontium), and Ba (barium). The $C_oC_o$ structure in $SiO_2$ can be converted to an electron trap by introducing a trivalent element or a bivalent element of B, Al, Ga, In, Sc, Y, La, Mg, Ca, Sr, Ba or the like. Hereinafter, a calculation result in the case of B will be shown, but the same also applies to the other elements.

When B is in $SiO_2$, carbon forms a CsOB structure in $SiO_2$, which is more stable than the CoCo structure. The CsOB structure is a structure where C (carbon) having replaced an Si atom, O (oxygen) in contact with that C and B (boron) having replaced an Si atom in contact with that O on the opposite side are bonded. That is, it is a structure where the Si—O—Si bond portion has been replaced with a C—O—B bond. Here, Al, Ga, In, Sc, Y, La, Mg, Ca, Sr or Ba may be used instead of B.

In particular, when B exists on a stage where carbon diffusion into $SiO_2$ is occurring, the CsOB structure is formed before formation of the CoCo structure. Therefore, the CsOB structure is reliably formed. According to the first principle calculation, gain of at least 1.2 eV is obtained per CsOB structure, and the CsOB structure is more stable than the CoCo structure in terms of energy.

Figure 7:
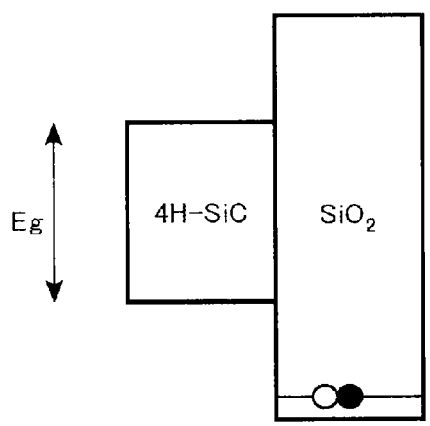
FIG. 7 is an explanatory diagram of the function and effect of the first embodiment.
Figure 8:
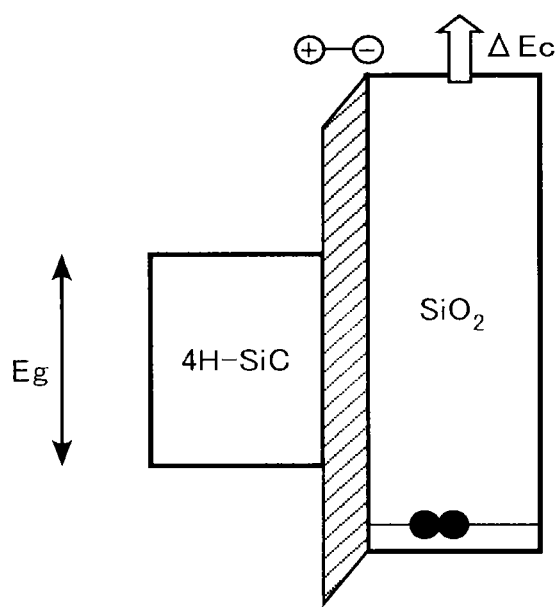
FIG. 8 is an explanatory diagram of the function and effect of the first embodiment.

FIG. 7 is an explanatory diagram of a state of electrons in the CsOB structure. Further, FIG. 8 is an explanatory diagram of a fixed dipole formed in the CsOB structure.

As shown in FIG. 7, when the state of electrons in the CsOB structure is calculated, an electron trap level is formed immediately over the valence band of $SiO_2$. Hence it is possible to move electrons from the interface state of the $SiC/SiO_2$ interface to this electron trap level. Accordingly, with movement of electrons to the $SiO_2$ side, a fixed dipole with a plus on the SiC side and a minus on the $SiO_2$ side can be formed as shown in FIG. 8.

When the CsOB structure is formed, the CoCo structure in $SiO_2$ does not exist both on the Si-plane and the C-plane. Hence the mobility degradation is suppressed.

Further, ΔEc is improved by the fixed dipole in the interface. Since electrons move from the interface state of the $SiC/SiO_2$ interface to this electron trap level, a fixed dipole is formed regardless of the plane direction (e.g., the Si-plane, the C-plane, the A-plane and the M-plane are representative). ΔEc is thus improved from the original position by approximately 0.2 eV to 0.6 eV regardless of the plane direction. Therefore, a gate leakage current is suppressed more as compared to that before introduction of the CsOB structure. For example, when a graph of a gate leakage and a gate applied voltage is drawn, a voltage at which the gate leakage begins is to be shifted to a large value.

For example, ΔEc has been decreased by approximately 0.4 eV (ΔEc has been decreased due to a charge trap to the CoCo structure) on the C-plane as compared to the Si-plane, but it is improved by approximately 0.5 eV (a dipole reversed to the past dipole is formed due to introduction of a charge trap to CsOB). Therefore, the difference is expected to be improved by approximately 0.9 eV to 1.0 eV.

Further, since the second adjacent oxygen replacement structure is thought to have remained even on the C-plane, the mobility on the C-plane is also improved. Accordingly, the mobility is expected to reach not less than 50 $cm^2/Vs$ regardless of the plane direction.

In the present embodiment, the concentration peak of B exists on the first SiC region 16 side in the gate insulating film 28. By the existence of B at a high concentration in the interface doped region 28a in the vicinity of the $SiC/SiO_2$ interface, the CsOB structure is effectively formed.

Then in the non-doped region 28b on the gate electrode 30 side, which is apart from the $SiC/SiO_2$ interface, B is not doped as much as possible. This allows prevention of deterioration in reliability due to the existence of the CsOB structure and B between spaces. That is, it is necessary to prevent an electron trap level from being generated on the inside of the film. Although B is preferably not at all contained in the non-doped region 28b, but this is not to prevent a fixed amount of B from being contained. The concentration of B in the non-doped region 28b is preferably as low as possible (approximately not higher than $1 \times 10^{16}$ $cm^{-3}$), and is preferably at least not higher than a detection limit (e.g., approximately not higher than $1 \times 10^{16}$ $cm^{-3}$ in the case of SIMS, and approximately not higher than $1 \times 10^{15}$ $cm^{-3}$ in the case of atom probing). Here, when the concentration is not higher than $1 \times 10^{16}$ $cm^{-3}$, the mobility and the reliability are thought to be not greatly affected, and hence the gate insulating film containing B in this degree of amount can be regarded as almost equivalent to that in the case of not containing B.

The CsOB structure in $SiO_2$ preferably exists in the vicinity of the $SiC/SiO_2$ interface such that electrons can be moved from the interface state of the $SiC/SiO_2$ interface. Hence the concentration peak of B is preferably in a range of not more than 5 nm from the interface between SiC (first SiC region 16) and the gate insulating film 28. When the concentration peak gets more distant than this, it becomes more difficult for electrons to move from the interface state, and a fixed dipole might not be formed. Moreover, for further ensuring movement of electrons, the range is preferably less than 1 nm. Although a skirt of a wave function is drawn to approximately 2.5 nm, the function is localized almost within 1 nm. Accordingly, the concentration peak is preferably in the range of not more than 5 nm for the purpose of ensuring sufficient superimposition, and if it can be made to be in the range of less than 1 nm, the purpose is reliably achieved.

The concentration of B at the concentration peak of B is preferably not lower than $5.6 \times 10^{17}$ $cm^{-3}$ and not higher than $5 \times 10^{20}$ $cm^{-3}$. When it falls below the above range, an amount of fixed dipoles might not be large enough to realize sufficient improvement in ΔEc. It is preferable to ensure ΔEc>0.01V.

A shift X (volts) in a quantity of fixed polarization made up of the insulating film and the SiC interface can be calculated by: X=(charge)×(area density)−(polarization length)/dielectric constant. A more detailed description is as follows: X (volts)=(charge)−(area density)×(polarization length)/dielectric constant=(charge $2 \times 1.602 \times 10^{-19}$ coulombs)×(area density $cm^{-2}$)×(polarization length×$10^{-8}$ cm)/(dielectric constant ε)/[$8.854 \times 10^{-12}$ (fard/m)]=$1.81 \times 10^{-14}$ (number area density in units of $cm^{-2}$)×(polarization length in units of Å)/(dielectric constant).

Here, the number of charges of a dangling bond in the SiC interface is 1, a number area density is approximately $10^{13}$ $cm^{-2}$ at the maximum, and a dielectric constant is 10. Since a lower limit of the number density is considered, a maximum value of the polarization length is adopted, to be approximately 10 nm, namely 100 Å (angstroms). Hence, X=$1.81 \times 10^{-14} \times 1 \times 10^{13} \times 100/10$=1.8 (V). Because 0.01 V is to be ensured, not lower than $0.0056 \times 10^{13}$ $cm^{-2}$ is required. If it is not higher than this, a necessary shift amount might not be obtained. When this is simply converted to a density in a uniform 1-nm film thickness, it is preferably not lower than $5.6 \times 10^{17}$ cm$^3$.

Further, when the density exceeds the above range, excess B might form an electron trap, to cause degradation in mobility and deterioration in reliability of the gate insulating film. An amount of carbon to come out from the substrate is, for example, not larger than $5 \times 10^{20}$ cm$^{-3}$ when an SIC/SiO$_2$ (thermal oxide film) structure is formed and measured. Accordingly, when B in a greater amount than this is introduced, it gets more likely that the CsOB structure is not formed and B is diffused to the electrode side of the insulating film. Therefore, the amount is preferably not larger than $5 \times 10^{20}$ cm$^{-3}$.

Further, from the viewpoint of moving electrons from the interface state existing on the SiC/SiO$_2$ interface to the CsOB structure in proper proportion, the amount of B is preferably equivalent to that in the interface state. From this viewpoint, the concentration of B at its concentration peak is preferably not lower than $5 \times 10^{18}$ cm$^{-3}$ and not higher than $5 \times 10^{19}$ cm$^{-3}$. It is possible that the area density in the interface state can be reduced to approximately $5 \times 10^{12}$ cm$^{-2}$ by introduction of nitride or the like. Therefore, with a width set to 1 nm to see an upper limit, the upper limit is preferably not higher than $5 \times 10^{19}$ cm$^{-3}$. As for a lower limit, with a width set to 10 nm, the lower limit is preferably not lower than $5 \times 10^{18}$ cm$^{-3}$.

From the above, the concentration of B at the concentration peak of B is preferably not lower than $5.6 \times 10^{17}$ cm$^{-3}$ and not higher than $5 \times 10^{20}$ cm$^{-3}$. It is more preferably not lower than $5 \times 10^{18}$ cm$^{-3}$ and not higher than $5 \times 10^{19}$ cm$^{-3}$. A target value of the amount of B is approximately $3 \times 10^{19}$ cm$^{-3}$, for example.

Further, in order to form the CsOB structure, C (carbon) to be paired with B needs to be contained in the interface doped region 28a of the gate insulating film 28. On the other hand, in the non-doped region 28b on the gate electrode 30 side apart from the SiC/SiO$_2$ interface, the concentration of C (carbon) that forms the electron state of being an electron trap is preferably as low as possible from the viewpoint of not leading to deterioration in reliability. That is, it is preferable to adopt a process where C is not contained as much as possible and make C not contained at least on the initial film formation stage.

Therefore, it is preferable that C (carbon) be contained in part of the gate insulating film 28 and the concentration peak of C (carbon) in the gate insulating film 28 be on the SiC (first SiC region 16) side of the gate insulating film 28. Further, the concentration peak of C (carbon) is preferably in a range of not more than 10 nm from the interface between SiC (first SiC region 16) and the gate insulating film 28. It is preferable that C be not at all contained in the non-doped region 28b, but this is not to exclude a case where a certain amount of C is contained. The concentration of carbon in the non-doped region 28b is preferably as low as possible (approximately not higher than $1 \times 10^{16}$ cm$^{-3}$), and is preferably at least not higher than a detection limit (e.g., approximately not higher than $1 \times 10^{16}$ cm$^{-3}$ in the case of SIMS, and approximately not higher than $1 \times 10^{15}$ cm$^{-3}$ in the case of atom probing). Here, when the concentration is not higher than $1 \times 10^{16}$ cm$^{-3}$, the mobility and the reliability are thought to be not greatly affected, and hence the gate insulating film in the case of containing C in this degree of amount can be regarded as almost equivalent to that in the case of not containing C.

Moreover, in order to form the CsOB structure, a quantitative ratio of C (carbon) to B (boron) in the vicinity of the SiC/SiO$_2$ interface in the gate insulating film 28 is preferably close to 1:1. Hence the concentration of B at the concentration peak of B is preferably not less than 80% and not more than 120% of the concentration of C (carbon) at the concentration peak of C (carbon). The concentration of C (carbon) at the concentration peak of C (carbon) is preferably not lower than $4.5 \times 10^{17}$ cm$^{-3}$ and not higher than $6 \times 10^{20}$ cm$^{-3}$, and preferably not lower than $5.6 \times 10^{17}$ cm$^{-3}$ and not higher than $5 \times 10^{20}$ cm$^{-3}$. Further, it is preferably not lower than $4 \times 10^{18}$ cm$^{-3}$ and not higher than $6 \times 10^{19}$ cm$^{-3}$, and more preferably not lower than $5 \times 10^{18}$ cm$^{-3}$ and not higher than $5 \times 10^{19}$ cm$^{-3}$.

Moreover, distributions of the concentration of C and the concentration of B in the film thickness direction preferably agree with each other in a range of not less than 80% and not more than 120%. For example, the use of a process shown in a below-mentioned second manufacturing method can make the concentration of B closer to the concentration of C by adjusting the concentration of B. At this time, the distributions of the concentration of C and the concentration of B in the film thickness direction agree well with each other, and the ratio is about 1:1. In the gate insulating film according to the second manufacturing method, B and C form the CsOB structure, and excess B remains in the upper part of the film. The remaining B is then removed by HF etching.

The concentrations of B (boron) and C (carbon) in the gate insulating film 28 and the concentration distributions thereof can be measured using SIMS (Secondary Ion Mass Spectrometry) or atom probing, for example.

Further, in the present embodiment, a fixed dipole with a plus on the SiC (first SiC region 16) side and a minus on the gate insulating film 28 side exists on the interface between the SiC (first SiC region 16) and the gate insulating film 28. The existence or absence of the fixed dipole and the polarity can be determined by measuring the film thickness dependency of the gate insulating film 28 having CV characteristics, for example.

By changing the film thickness of the gate insulating film, an effective work function of the gate electrode is measured. A flat band shift (Vfb) of a CV curve and the film thickness dependency of the gate insulating film are measured, and by extrapolation to a point 0 of the insulating film, namely by a value on an intercept of a Vfb-axis, the effective work function ($\phi$eff) can be found.

For example, a work function of phosphorus doped polysilicon is approximately 4.1 eV, but when SiO$_2$ is formed on the C-plane of the SiC substrate, the effective work function becomes approximately 4.6 eV. This indicates that a dipole, which has a plus on the insulating film side and a minus on the substrate side and brings about a 0.5-eV shift, has been formed on the interface.

Next, for example when the effective work function is measured in the case of the present embodiment where the below-mentioned second manufacturing method is used for the manufacturing, it is approximately 3.6 eV. This indicates that a dipole, which has a minus on the insulating film side and a plus on the substrate side and brings about a 0.5-eV shift, has been formed on the interface. In this manner, the characteristics of the fixed dipole can be measured.

It should be noted that the description has been given by taking, as the example, the case where the element contained in the gate insulating film 28 is B (boron), the oxide film or the oxynitride film is the silicon oxide film and the entire gate insulating film 28 is also the silicon oxide film, but a configuration other than this configuration can also be applied.

Even in the oxynitride film other than the oxide film, containment of O (oxygen) therein allows formation of the CsOB structure in the film and formation of the fixed dipole on the interface.

To the element contained in the oxide film or the oxynitride film, there can be applied an element selected from Al (aluminum), Ga (gallium), In (indium), Sc (scandium), Y (yttrium), La (lantern), Mg (magnesium), Ca (calcium), Sr (strontium), Ba (barium), in addition to B (boron), as described above. To the element contained in the oxide film or the oxynitride film, B (boron) or Al (aluminum) is preferably applied since these are easily replaced with Si and apt to form the CsOB structure. Further, as compared to Al, B (boron) is more preferably applied since it is less apt to form an oxide and a silicide and more apt to form the CsOB structure.

To the oxide film or the oxynitride film, other than the silicon oxide film ($SiO_2$) and the silicon oxynitride film (SiON), there can also be applied high dielectric films such as a hafnium oxide film ($HfO_2$), a hafnium oxynitride film (HfON), a hafnium silicate oxide film (HfSiO), a hafnium silicate oxynitride film (HfSiON), a zirconium oxide film ($ZrO_2$), a zirconium oxynitride film (ZrON), a zirconium silicate oxide film (ZrSiO), a zirconium silicate oxynitride film (ZrSiON), alumina ($Al_2O_3$) and alumina nitride (AlON), for example.

However, when a height of a barrier is considered, the $SiO_2$ film or the SiON film is suitably formed in the vicinity of the interface. For example, the $SiO_2$ film or the SiON film may be formed at least part of the vicinity of the SiC-side interface, to form a structure of substantially three or more layers such as layers of B-doped SiON (1 nm)/non-doped $SiO_2$ (HTO film, 9 nm)/non-doped HfSiON (30 nm), from the substrate interface side. At this time, B is thought to be slightly diffused, but in accordance with the diffusion, part of the first layer and part of the second layer on the SiC side can be regarded as an interface doped region, and the remaining portion of the second layer (with small diffusion) and the top layer can be regarded as an non-doped region.

Here, attention is required for Al in $Al_2O_3$. It is important that Al in the present embodiment replaces the position of Si in $SiO_2$, to form a CsOAl structure. As opposed to this, $Al_2O_3$ does not have a configuration formed by replacing Si in $SiO_2$ with Al, but has a configuration peculiar to an $Al_2O_3$ material.

Further, the gate insulating film 28 may be a stacked film of an oxide film or an oxynitride film with a high concentration of an element such as B and a film with a sufficiently lower concentration of the element such as B than that of the oxide film or the oxynitride film, namely a film in which B is detected only in amount not larger than the detection limit. For example, the oxide film or the oxynitride film may be a silicon oxide film with a high concentration of B, and thereon, a hafnium oxide film with a sufficiently low concentration of B may be stacked. Alternatively, a stacked film of a silicon oxide film with a high concentration of B and a silicon nitride film with a sufficiently low concentration of B may be formed. Alternatively, a stacked film of a silicon oxide film with high concentrations of B and C and an HTO (High Temperature Oxide) film with sufficiently low concentrations of B and carbon may be formed. Naturally, it is better that B is not doped in the non-doped region. The more B exists, the more it causes deterioration in characteristics.

Next, a first manufacturing method for the semiconductor device of the present embodiment will be described.

In the first manufacturing method for the semiconductor device of the present embodiment, a first insulating film made of an oxide film or an oxynitride film containing at least one element selected from B (boron), Al (aluminum), Ga (gallium), In (indium), Sc (scandium), Y (yttrium), La (lantern), Mg (magnesium), Ca (calcium), Sr (strontium), and Ba (barium), is formed on an SiC layer, an insulating film with a concentration sufficiently lower than that of the first insulating film is formed on the first insulating film, and a gate electrode is formed on the insulating film. Here, being sufficiently low means being non-doped, but in reality, it means being not higher than the detection limit. For example, the concentration is not higher than $1 \times 10^{16}$ $cm^{-3}$.

Figure 9:
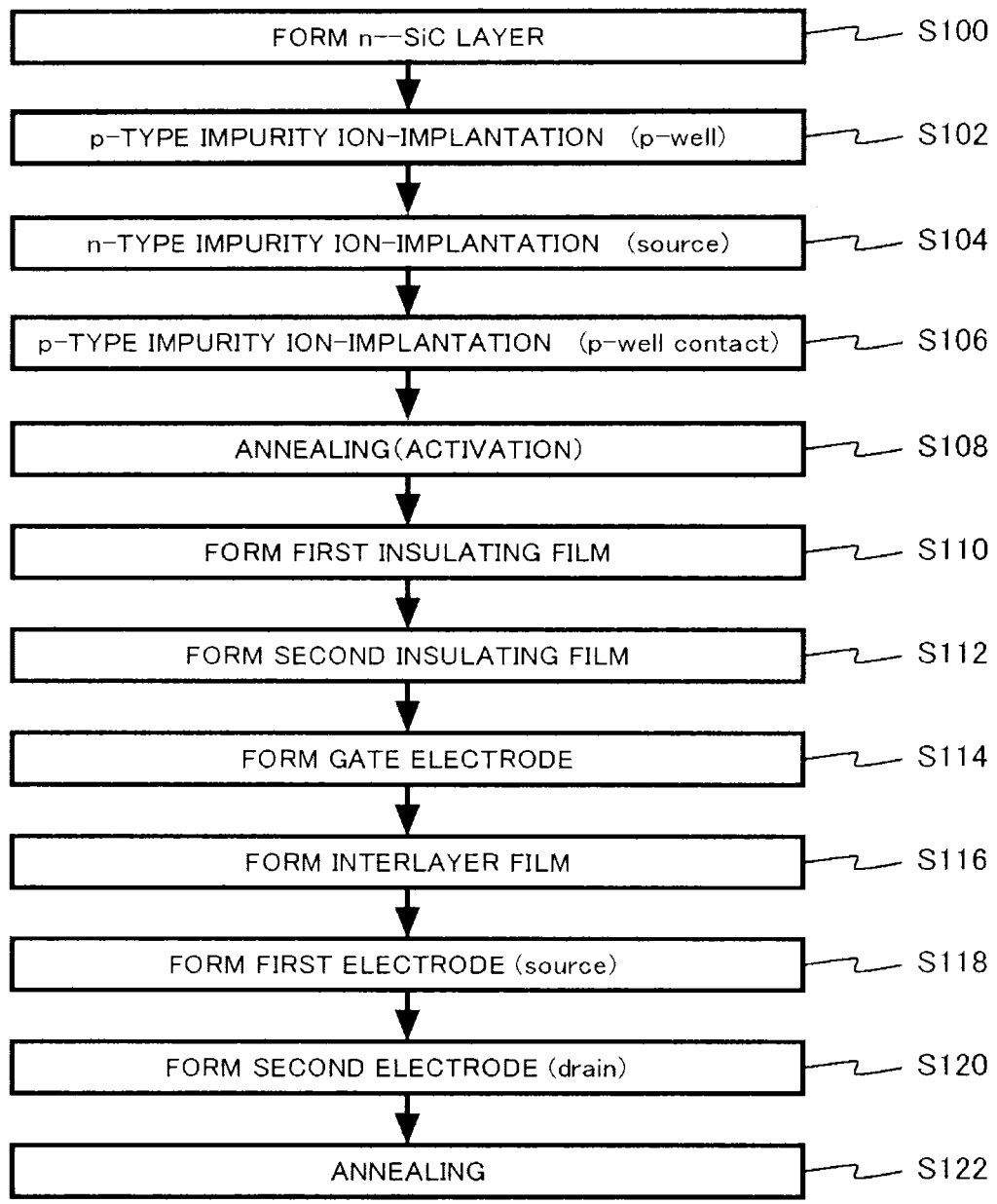
FIG. 9 is a process flowchart showing a manufacturing method for the semiconductor device of the first embodiment.

FIG. 9 is a process flowchart showing an example of the first manufacturing method for the semiconductor device the present embodiment. FIGS. 10 to 15 are schematic cross-sectional views showing the first manufacturing method for the semiconductor device of the present embodiment.

As shown in FIG. 9, the first manufacturing method for the semiconductor device includes: forming an $n^-$-SiC layer (step S100); ion-implanting a p-type impurity (step S102); ion-implanting an n-type impurity (step S104); ion-implanting a p-type impurity (step S106); annealing (step S108); forming a first insulating film (step S110); forming a second insulating film (step S112); forming 3 gate electrode (step S114); forming an interlayer film (step; S116); forming a first electrode (step S118); forming a second electrode (step S120); and annealing (step S122).

First prepared is the low-resistance n-type SiC substrate 12 of 4H—SiC that contains P (phosphorus) or N (nitrogen) as the n-type impurity at an impurity concentration of approximately $5 \times 10^{18}$ $cm^{-3}$, and has a thickness of 300 µm, for example.

In step S100, the high-resistance $n^-$-SiC layer 14 that contains N as the n-type impurity at an impurity concentration of approximately $1 \times 10^{16}$ $cm^{-3}$ and has a thickness of approximately 10 µm, for example, is epitaxially grown on the C-plane of the SiC substrate 12 by epitaxial growth.

Figure 10:
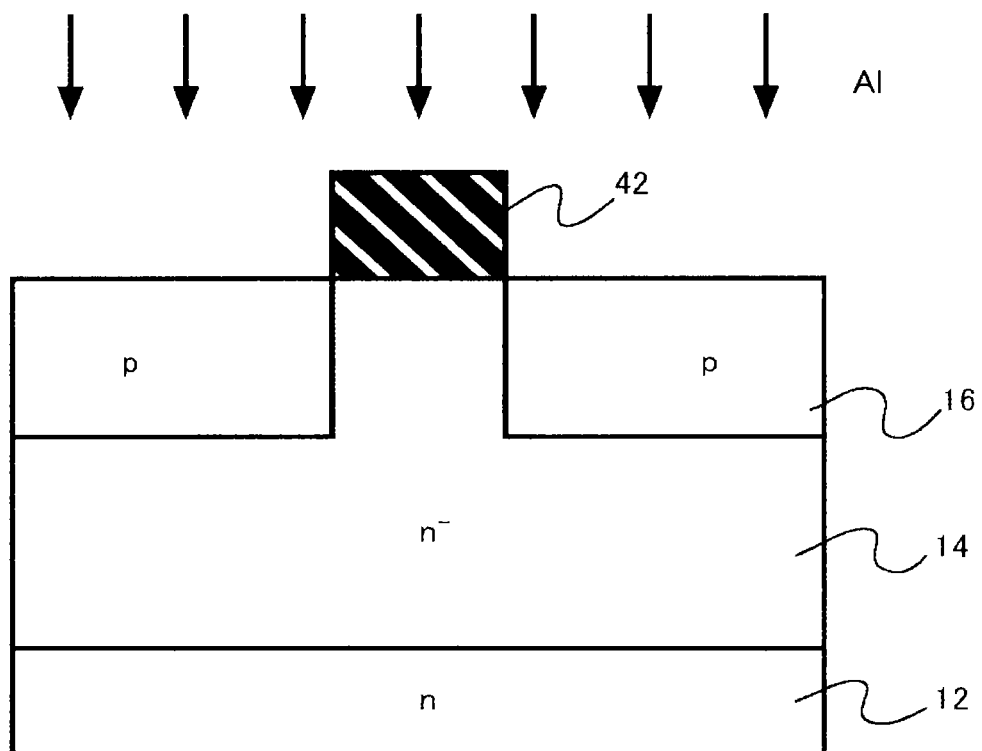
FIG. 10 is a schematic cross-sectional view showing a first manufacturing method for the semiconductor device of the first embodiment.

After that, patterning is performed by photolithography and etching, to form a first mask material 42 of $SiO_2$, for example. In step S102, Al as the p-type impurity is ion-implanted into the $n^-$-SiC layer 14 by use of the first mask material 42 as an ion implantation mask, to form the first SiC region (p-well region) 16 (FIG. 10).

Figure 11:
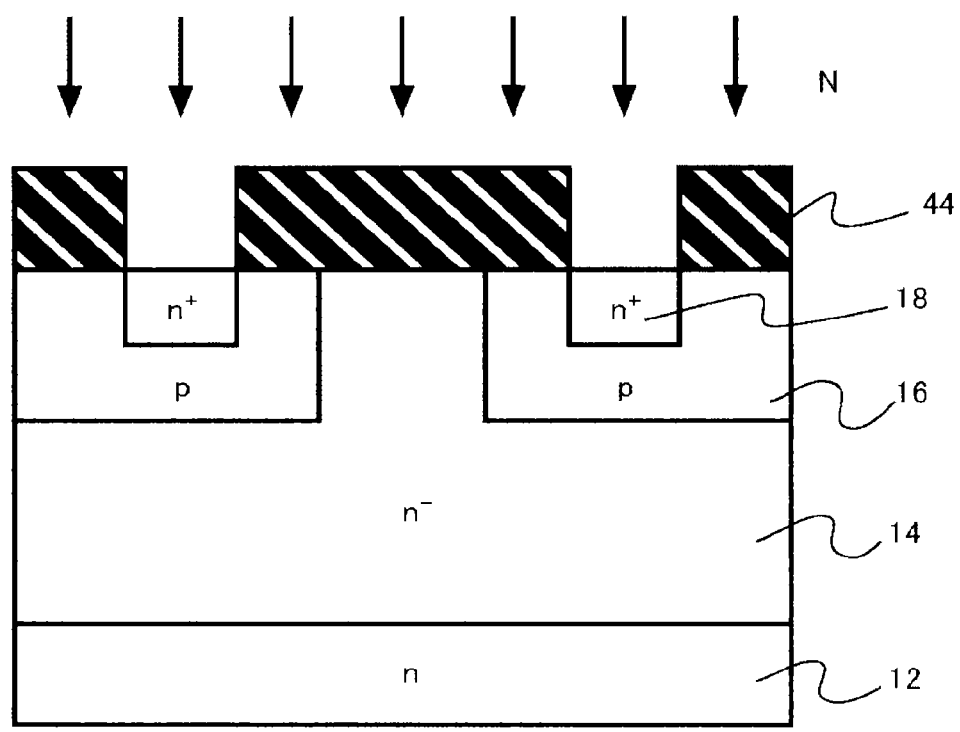
FIG. 11 is a schematic cross-sectional view showing a first manufacturing method for the semiconductor device of the first embodiment.

After that, patterning is performed by photolithography and etching, to form a second mask material 44 of $SiO_2$, for example. In step S104, N (or P) as the n-type impurity is ion-implanted into the $n^-$-SiC layer 14 by use of the second mask material 44 as an ion implantation mask, to form the second SiC region (source region) 18 (FIG. 11).

Figure 12:
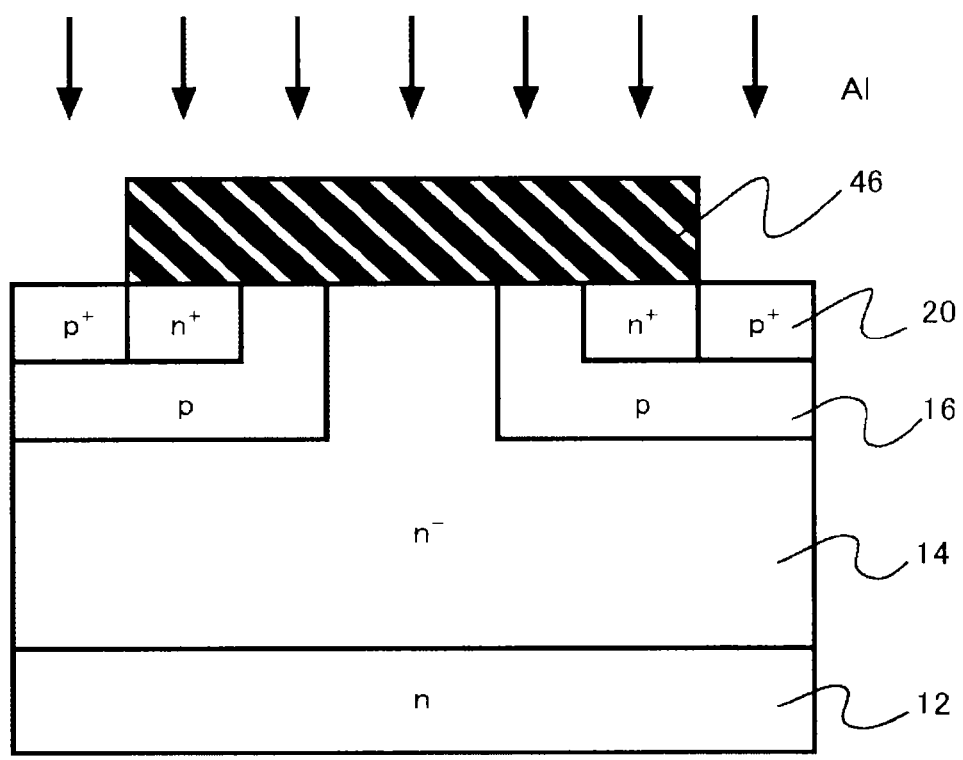
FIG. 12 is a schematic cross-sectional view showing the first manufacturing method for the semiconductor device of the first embodiment.

After that, patterning is performed by photolithography and etching, to form a third mask material 46 of $SiO_2$, for example. In step S106, Al as the p-type impurity is ion-implanted into the $n^-$-SiC layer 14 by use of the third mask material 46 as an ion implantation mask, to form the third SiC region (p-well contact region) 20 (FIG. 12).

In Step S108, annealing is performed for activating the p-type impurity and the n-type impurity. Conditions for the annealing are that an argon (Ar) gas is used as an atmosphere gas, a heating temperature is 1600° C., and a heating period is 30 minutes, for example. At this time, activation of the impurities introduced into the SiC can be realized, but diffusion is small.

Figure 13:
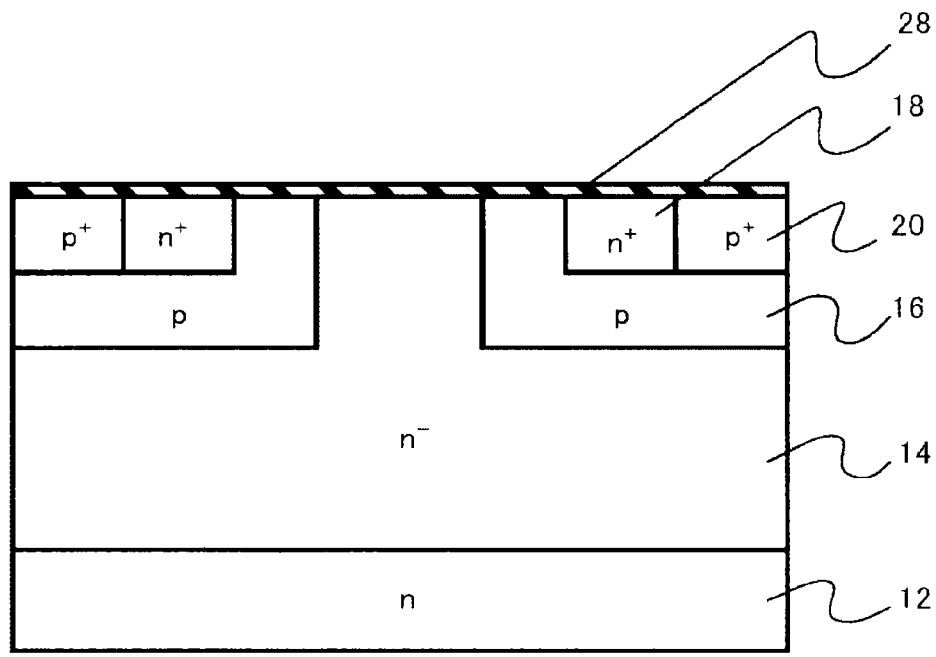
FIG. 13 is a schematic cross-sectional view showing the first manufacturing method for the semiconductor device of the first embodiment.

The gate insulating film 28 is formed by step S110 and step S112 (FIG. 13). The first insulating film formed in step S110 corresponds to the interface doped region 28a shown in FIG. 2A. Further, the second insulating film formed in step S112 corresponds to the non-doped region 28b shown in FIG. 2B.

In step S110, the first insulating film, made of the oxide film or the oxynitride film that contains at least one element selected from B (boron), Al (aluminum), Ga (gallium), In (indium), Sc (scandium), Y (yttrium), La (lantern), Mg (magnesium), Ca (calcium), Sr (strontium), and Ba (barium), is formed.

The first insulating film is formed by the following process, for example. First, a silicon film containing B (boron) is deposited by CVD (Chemical Vapor Deposition), for example. Then, this silicon film is thermally oxidized, to form a silicon oxide film containing B at a high concentration.

A film thickness of the silicon film containing B (boron) is not smaller than 1 nm and not larger than 5 nm, for example. Further, a film thickness of the silicon oxide film formed through thermal oxidation is not smaller than 2 nm and not larger than 10 nm, for example. In the present embodiment, a B-doped polysilicon with a thickness of about 3 nm is formed, to obtain B-doped $SiO_2$ of about 6 nm. B is concentrated in the vicinity of the $SiC/SiO_2$ interface by a snow-plow effect (when B in Si is oxidized, it is pressed to the Si side). Further, since stabilization by electron movement to CsOB is gain that occurs only when the CsOB structure is in the vicinity of the interface, the CsOB structure is concentrated on the interface. By the two effects as thus described, B and C are to be concentrated on the $SiC/SiO_2$ interface, to have concentration peaks.

In this example, before the surface of SiC is oxidized and C (carbon) is released, a film containing B is deposited on the surface of SiC. Therefore, at the time of forming the silicon oxide film, the CsOB structure can be formed in the vicinity of the SiC/SiO: interface in the silicon oxide film before formation of the $C_oC_o$ structure. This allows formation of the CsOB structure in a relatively low-temperature process. A high temperature (e.g., 1200° C.) is required for breaking the once formed CoCo structure and forming the CsOB structure, but here, the oxidation is to be performed at 700° C. to 900° C. A temperature, at which Si is oxidized but SiC is hardly oxidized, has been selected. This temperature is not lower than 600° C. and not higher than 1000° C. A lower temperature is better when the interface degradation is considered, but a higher temperature is better when a throughput is considered. When the plane direction dependency in oxidation of SiC is considered, approximately 700° C. is suitable for the C-plane, approximately 800° C. is suitable for the A-plane and the M-plane, and approximately 900° C. is suitable for the Si-plane.

The first insulating film may be formed by oxynitrizing the above silicon film containing B (boron). Further, the first insulating film may be formed by forming the silicon oxide film containing B (boron), for example, by CVD, for example.

In step S112, on the first insulating film, the second insulating film with a lower concentration of the element such as B (boron) than that of the first insulating film is formed. For example, a film not containing the element such as B is formed. The second insulating film is an HTO film formed by CVD, for example. The HTO film is a preferable film as the second insulating film since it has a low content of C (carbon). After step S112, for densifying the HTO film, annealing may be performed in a non-oxidizing atmosphere (e.g., in $N_2$ at 1000° C. for 30 minutes).

The film thickness of the second insulating film is not smaller than 30 nm and not larger than 100 nm. The smaller the film thickness is, the more the driving performance can be improved, but leakage then becomes larger. The case of the smallest film thickness is a film thickness with which insulation breakdown is avoided, and thought to be approximately 30 nm. The larger the film thickness, the better it is for increasing the insulation resistance, but the driving performance then becomes excessively low. Its upper limit is approximately 100 nm. Practically, a film thickness of approximately 50 nm converted to a film thickness of the $SiO_2$ film is normally employed. This is because, when Ec is low, the leakage does not stop if the film thickness is smaller than approximately 50 nm. However, in the present embodiment, ΔEc is improved and it is thus possible to seek a region with a smaller thickness. In the present embodiment, around 40 nm is set as a target. Here, an HTO film of about 40 nm is used.

Figure 14:
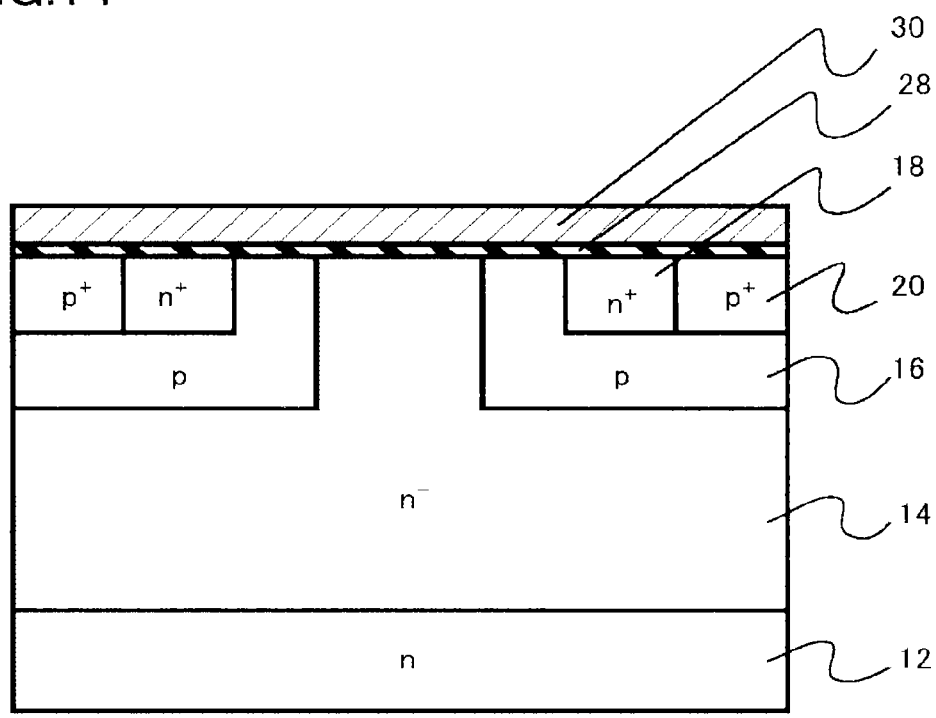
FIG. 14 is a schematic cross-sectional view showing the first manufacturing method for the semiconductor device of the first embodiment.
Figure 15:
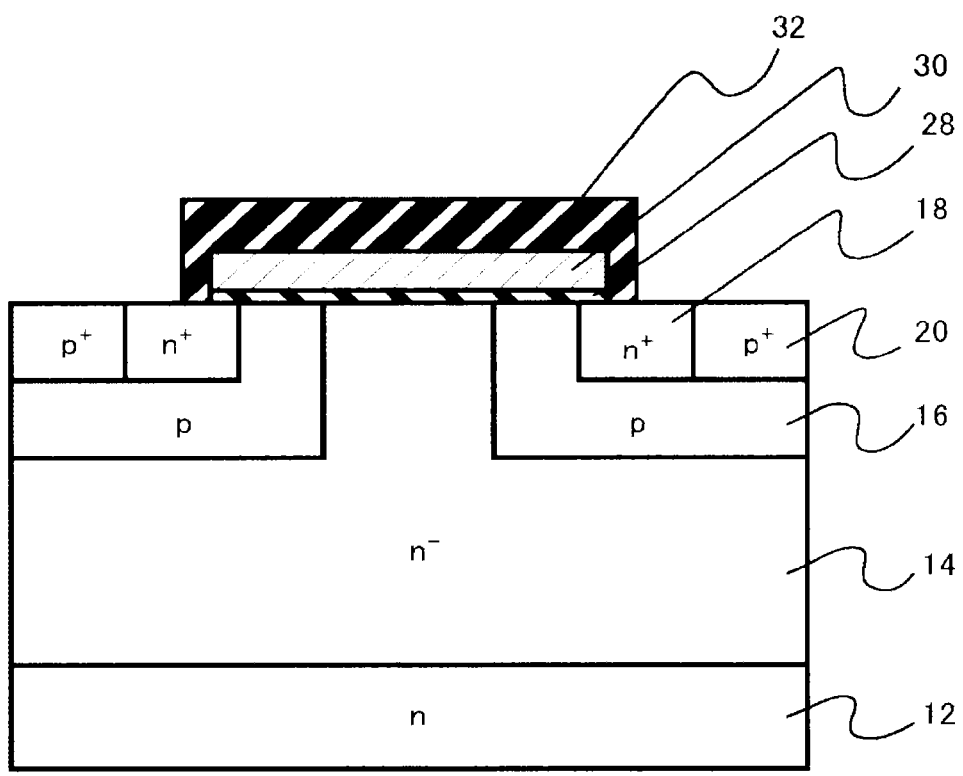
FIG. 15 is a schematic cross-sectional view showing the first manufacturing method for the semiconductor device of the first embodiment.

In step S114, the gate electrode 30 of polysilicon, for example, is formed on the gate insulating film 28 (FIG. 14). Then in step S116, the interlayer insulating film 32 made of an $SiO_2$ film, for example, is formed on the gate electrode 30 (FIG. 15).

After that, in step S118, the conductive first electrode (source/p-well common electrode) 24 is formed which is electrically connected to the second SiC region (source region) 18 and the third SiC region (p-well contact region) 20. The first electrode (source/p-well common electrode) 24 is formed by sputtering of Ni (nickel) and Al, for example.

In step S120, the conductive second electrode (drain electrode) 36 is formed on the second plane side of the n⁻SiC substrate 12. The second electrode (drain electrode) 36 is formed by sputtering of Ni, for example.

In step S122, in order to reduce the contact resistance between the first electrode 24 and the second electrode 36, annealing is preferably performed at a temperature as low as possible. The annealing is performed in an argon gas atmosphere at 400° C. to 1000° C., for example. Here, it is performed at 800° C.

By the above described manufacturing method, the MOSFET 10C shown in FIG. 1 is formed.

The MOSFET 100 of the present embodiment includes the CsOB structure and the fixed dipole on the SiC side of the gate insulating film 28. Hence the band offset (ΔEc) increases, to suppress a leakage current of the gate insulating film formed on the C-plane. Further, since there is no $C_oC_o$ structure on the SiC side of the gate insulating film 28 (C has been converted to the CsOB structure in the film), the carrier mobility is further improved. According to the manufacturing method for the MOSFET 100 of the present embodiment, it is possible to form the MOSFET 100 provided with the above excellent effects.

In the case of manufacturing a semiconductor device by the above first manufacturing method, ΔEc has increased by about 0.9 eV as compared to the initial value. In such a manner, even in the case of a thin film of 46 nm, gate leakage has hardly occurred. Furthermore, the mobility has increased, to be about 100 cm²/Vs. This value, 100 cm²/Vs, is a sufficient value for use in the MOSFET. Since there is no trap in the vicinity of the interface, the reliability has also been improved, and a threshold shift after the lapse of 1000 hours from application of ±20 V is smaller than 0.1 V. In such a manner, there is obtained a MOSFET of SiC, which has: (1) excellent driving performance (film-thinning effect); (2) no gate leakage; (3) high mobility (effect of concentration of CsOB in a region of a several nm from the interface); and (4) high reliability.

Locking at SIMS data of the gate insulating film manufactured by the first manufacturing method, B and C have concentration peaks thereof at positions about 0.8 nm on the inside of $SiO_2$ from the interface, and have concentrations of approximately $2 \times 10^{19}/cm^3$ (converted to an area density of approximately $2\times10^{13}/cm^2$), and the positions are well agreed. This is thought to have led to an increase in $\Delta Ec$ by about 0.9 eV as compared to the initial value. Further, at a position that is not less than 5 nm apart from the concentration peak, the concentrations of B and C are not higher than the detection limit.

Further, the CsOB structure has also been formed on the interface (hereinafter referred to as JFET region interface) between the $n^-$-SiC layer 14 and the gate insulating film 28. Also here, with $\Delta Ec$ being high, the insulation breakdown resistance in this portion has also been improved.

Next, the second manufacturing method for the semiconductor device of the present embodiment will be described. The second manufacturing method is different from the first manufacturing method in a manufacturing method for the gate insulating film.

The first insulating film is formed by the following process, for example. First, a silicon film containing B (boron) is deposited by CVD (Chemical Vapor Deposition), for example. Then, this silicon film is thermally oxidized, to form a silicon oxide film containing B at a high concentration. The film thickness of the silicon film containing B (boron) is approximately 3 nm, for example, and B-doped $SiO_2$ film of approximately 6 nm is formed through thermal oxidation.

In the process of thermal oxidation, (1) B is concentrated on the SiC side (pressed out to the Si side during oxidation: snow-plow effect), (2) C is released from the substrate, and (3) a CsOB structure is formed. Consequently, an interface dipole is formed. A pair of B and C is formed on the SiC side in the $SiO_2$ insulating film, to cause occurrence of the electron movement from the SIC interface state, and a dipole is formed, leading to stabilization. In this manner, the CsOB structure is concentrated in the vicinity of the SiC layer.

Here, HF treatment is additionally performed on the surface of B-doped $SiO_2$. B and C in a region apart from the substrate become traps, and hence such B and C need to be decreased as much as possible. For this purpose, it is effective to reduce the film thickness to not larger than 10 nm by etching such as HF treatment. The film thickness is ideally not larger than 1 nm, and it is made as small as possible. For example, it is reduced to 1 nm. Thereby, the first insulating film is formed. This 1-nm region is the interface region and the CsOB structure is confined in this region.

Next, on the first insulating film, an HTO (High Temperature Oxide) film originally fundamentally not containing B and C and having a thickness of 40 nm, for example, is formed as the second insulating film. When the interface is made as thin as 1 nm, a converted film thickness of the entire gate insulating film is approximately 41 nm.

By the above second manufacturing method, there is formed a gate insulating film with a first insulating film of 1 nm and a second insulating film of 40 nm. In this case, B and C are not introduced at all into HTO that is not less than 1 nm apart from the substrate. Checking by atom probing indicates that each of concentration peaks of B and C is observed at a position less than 1 nm from the interface in $SiO_2$, each of concentrations thereof is about $2\times10^{19}/cm^3$, and thus both the amounts and distributions thereof well agree with each other.

On the other hand, in an non-doped region thereon, each of the amounts of B and C is not larger than the detection limit ($1\times10^{16}/cm^3$, but practically, they are hardly contained). Since B and C form traps in $SiO_2$, they are not to be introduced thereinto other than the $SiC/SiO_2$ just interface. In accordance with the above second manufacturing method, B and C form a stable configuration, CsOB, in a portion being 1 nm from the interface and form dipoles, and do not become new traps. B and C are confined within 1 nm, and hardly diffused in the HTO film that is formed in a position not less than 1 nm apart from the interface.

As a result, in the gate insulating film manufactured by the above second manufacturing method, $\Delta Ec$ has increased by about 1.0 eV as compared to the initial value. Accordingly, gate leakage hardly occurs even though it is a thin film of 41 nm. Furthermore, the mobility has increased, to be about 120 $cm^2/Vs$. Since there is no trap in the vicinity of the interface, the reliability has also been improved, and a threshold shift after the lapse of 1000 hours from application of ±20 V is smaller than 0.1 V.

In such a manner, there has been obtained a MOSFET of Sic, which has: (1) excellent driving performance (film-thinning effect); (2) no gate leakage; (3) high mobility (effect of concentration of CsOB in a region of 1 nm from the interface); and (4) high reliability. Further, it is similar to the case of the manufacturing by the first manufacturing method in that the insulation breakdown resistance in the JFET region interface has been improved.

Looking at SIMS data, B and C have concentration peaks thereof at positions about 1 nm on the inside of $SiO_2$ from the interface, and have concentrations of approximately $3\times10^{19}/cm^3$ (converted to an area density of approximately $3\times10^{13}/cm^2$), and the positions are well agreed with each other. It is thought that this leads to an increase in $\Delta Ec$ by about 1.0 eV as compared to the initial value. Further, at a position that is not less than 2 nm apart from the concentration peak, the concentrations of B and C have become not higher than the detection limit. An extremely thin interface doped layer has been formed.

Here, a substance other than B can be formed in a similar manner. Silicon containing Al (aluminum), Ga (gallium), In (indium), Sc (scandium), Y (yttrium), La (lantern), Mg (magnesium), Ca (calcium), Sr (strontium), or Ba (barium), is formed into a film of several nm. For example, it may be formed by sputtering with a pellet of silicide of the above substance taken as a target. Alternatively, the film may be formed by alternately forming the above substance and silicon by CVD. In such a manner, amorphous silicon containing the above substance may be formed and then oxidized. When the oxide film as thus formed is subjected to HF treatment and a process following the second manufacturing method, a MOS interface having almost the same characteristics is formed.

Next, a third manufacturing method for the semiconductor device of the present embodiment will be described. The third manufacturing method is different from the first manufacturing method in a manufacturing method for the gate insulating film. In place of the thermal oxidation in the first manufacturing method, NO oxynitridization (this also applies to the use of $N_2O$) was performed.

The first insulating film is formed by the following process, for example. First, a silicon film containing B (boron) is deposited by CVD (Chemical Vapor Deposition), for example. Then, this silicon film is NO-oxynitridized, to form a silicon oxynitride film containing B at a high concentration. The film thickness of the silicon film containing B (boron) is approximately 3 nm, for example, and B-doped $SiO_2$ film of approximately 6 nm to be the first insulating film is formed through NO oxynitridization.

In the process of NO oxynitridization, (1) B is concentrated on the SiC side (pressed out to the Si side during oxidation: snow-plow effect), (2) C is released from the substrate, and (3) a CsOB structure is formed. Consequently, an interface dipole is formed. A pair of B and C is formed on the SiC side in the $SiO_2$ insulating film, to cause occurrence of the electron movement from the SiC interface state, and a dipole is formed, leading to stabilization. In this manner, the CsOB structure is concentrated in the vicinity of the SiC layer. (4) In NO oxynitridization, N is further introduced to the interface, to further repair a remaining interface defect.

When a dangling bond exists on the interface, the state becomes a high energy state, but when nitride comes, the state is converted to a low energy state. That is, part of the surface element (Si for Si-plane, C for C-plane, Si and C for A-plane and M-plane) in the high energy state is replaced with N, and nitride is introduced to carbon Vc in the substrate. Here, HF treatment is similarly applied to the surface of thin film of $SiO_2$.

Next, on the first insulating film, the second insulating film with a lower concentration of an element such as B (boron) than that of the first insulating film is formed. For example, a film not containing the element such as B is formed. The second insulating film is an HTO film formed by CVD, for example.

In the gate insulating film formed by the third manufacturing method, B and C are not introduced at all into HTO that is not less than 1 nm apart from the substrate. Checking by atom probing indicates that each of concentration peaks of B and C is observed at a position less than 1 nm from the interface in the $SiO_2$, each of concentrations thereof is about $2 \times 10^{19}/cm^3$, and thus both the amounts and distributions thereof well agree with each other.

On the other hand, in an non-doped region above that, each of the amounts of B and C is not larger than the detection limit. In accordance with the third manufacturing method, B and C form a stable configuration such as CsOB in a region of 1 nm from the interface and form dipoles, and do not become new traps. B and C are confined in the region of 1 nm, and hardly diffused in the HTO film that is formed not less than 1 nm apart from the interface. Further, nitride is introduced to the just interface, to suppress the mobility degradation.

As a result, in the gate insulating film manufactured by the third manufacturing method, Ec has increased by about 1.0 eV as compared to the initial value. Accordingly, gate leakage hardly occurs even though it is a thin film of 41 nm. Furthermore, the mobility has increased, to be about 250 $cm^2/Vs$. Such high mobility can be obtained due to addition of termination of the dangling bond in the just interface and termination of a carbon defect in the substrate by nitride. Since there is no trap in the vicinity of the interface, the reliability has also been improved, and a threshold shift after the lapse of 1000 hours from application of ±20 V is smaller than 0.1 V.

In such a manner, there is obtained a MOSFET made of SiC, which has: (1) excellent driving performance (film-thinning effect); (2) no gate leakage; (3) high mobility (effect of concentration of CsOB in a region of 1 nm from the interface, and nitride termination effect); and (4) high reliability. Further, it is similar to the case of the manufacturing by the first and second manufacturing methods in that the insulation breakdown resistance in the JFET region interface has been improved.

Looking at SIMS data, B and C have concentration peaks thereof at positions about 1 nm on the inside of $SiO_2$ from the interface, and have concentrations of approximately $3 \times 10^{19}/cm^3$ (converted to an area density of approximately $3 \times 10^{13}/cm^2$), and the positions are well agreed with each other. It is thought that this leads to an increase in ΔEc by about 1.0 eV as compared to the initial value. Further, at a position that is not less than 2 nm apart from the concentration peak, the concentrations of B and C have become not higher than the detection limit. An extremely thin interface doped layer has been formed. Further, nitride has a concentration peak in the just interface and also draws a tail on the SiC substrate side. Such high mobility is thought to be over performance for the MOSFET, but it is optimal when a MOS interface with a high energy density is needed in a bipolar device such as an IGBT.

Figure 16:
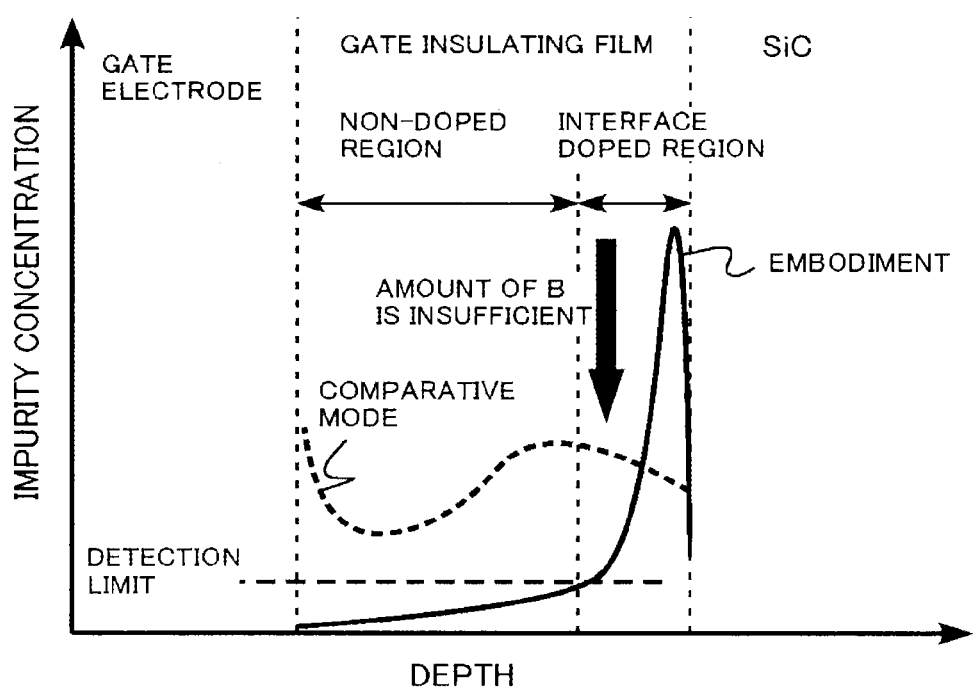
FIG. 16 is a diagram showing element distributions of gate insulating films of the first embodiment and a comparative mode.

As a manufacturing method in a comparative mode, there will be considered a manufacturing method in which a thick film $SiO_2$ (approximately 55 nm) is formed as the gate insulating film and B is thereafter diffused. FIG. 16 is a diagram showing distributions of the element (B) in the gate insulating films of the present embodiment and a comparative mode. As shown in FIG. 16, in the comparative mode, it is extremely difficult to create the element distribution shown in the present embodiment where an insulating film with B and C non-doped on the electrode side thereof is formed and sufficient B is concentrated on the SiC-side interface.

As a result, it becomes difficult to improve ΔEc, but when the insulating film is made to have a small thickness, gate leakage becomes large. Hence the thickness of the gate insulating film cannot be made small, and the driving characteristics cannot be expected to be improved. Further, with the CoCo structure formed in the insulating film, a portion not converted to the CsOB structure remains, to bring about the mobility degradation. Simultaneously, B and C diffused throughout the insulating film form traps, to bring about large threshold shifts.

Looking at SIMS data of the gate insulating film manufactured in the comparative mode, B has a broad concentration peak at a position about 6 nm on the inside of $SiO_2$ from the interface, but has a concentration of approximately $1 \times 10^{17}/cm^3$ (converted to an area density o?f approximately $1 \times 10^{10}$ $cm^2$). Further, since C is only distributed uniformly and does not have a concentration peak, it is thought that the CsOB structure has not been formed.

As a result, ΔEc remains unchanged in the gate insulating film manufactured in the above comparative mode. Further, even in a position in the insulating film and not less than 10 nm apart from the interface, the concentrations of B and C have not been on or below the detection limit, and it is thus found that charge traps have been distributed. Accordingly, the mobility is low, to be about 10 $cm^2/Vs$. The threshold shifts are also large, and in measurement with ±20 V for 1000 hours, shifts of not smaller than 2 V is observed.

(Second Embodiment)

The present embodiment is similar to the first embodiment except that the MOSFET in the first embodiment is one formed on the C-plane, namely the (000-1) plane, whereas in the present embodiment, it is one formed on the Si-plane, namely the (0001) plane. Therefore, the same explanations as those in the first embodiment will not be repeated.

Figure 17:
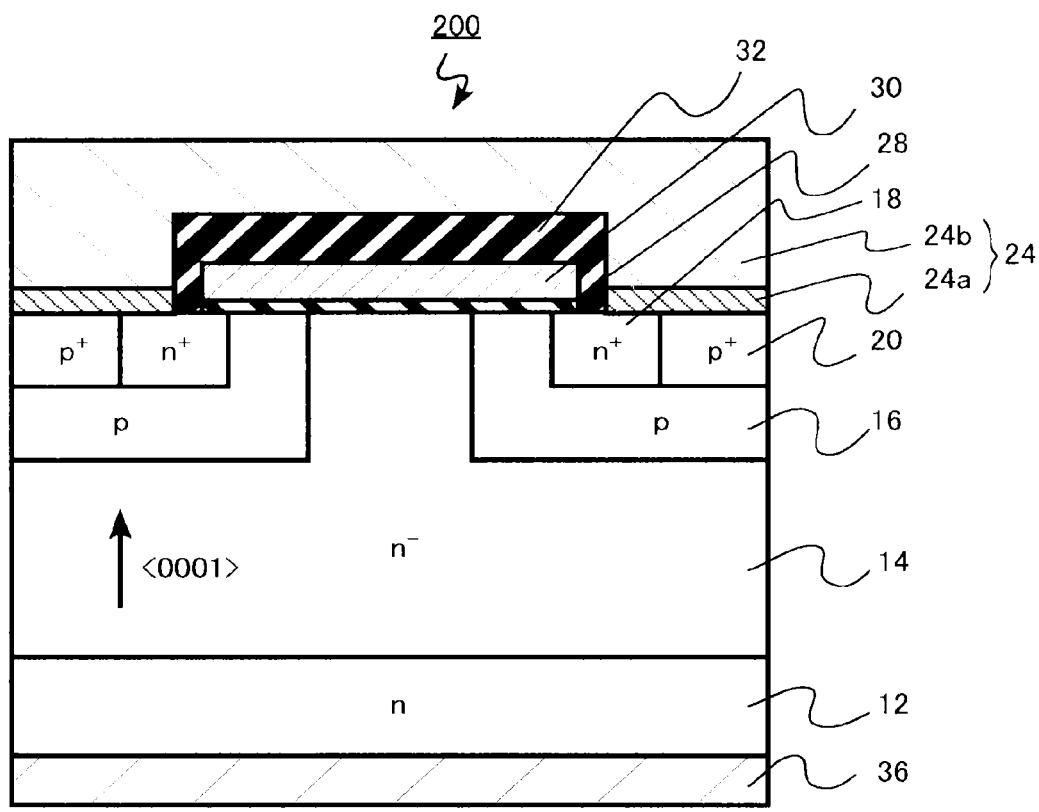
FIG. 17 is a schematic cross-sectional view showing a semiconductor device of a second embodiment.

FIG. 17 is a schematic cross-sectional view showing a configuration of a MOSFET as a semiconductor device of the present embodiment. A MOSFET 200 is a vertical transistor where carriers are moved between a source electrode on the surface side of a semiconductor substrate and a drain electrode on the rear surface side of the same.

This MOSFET 200 is provided with the SiC substrate 12 having first and second planes. In FIG. 17, the first plane is the upper plane, and the second plane is the lower plane. This SiC substrate 12 is an SiC substrate (n-substrate) of 4H—SiC that contains N (nitrogen), for example, as an n-type impurity at an impurity concentration of not lower than $1\times10^{18}$ cm$^3$ and not higher than $1\times10^{19}$ cm$^{-3}$, for example.

The first plane is the Si-plane, namely the (0001) plane. The first plane may be offset in a range of not larger than 8 degrees, for example, with respect to the Si-plane.

The structure and the manufacturing method is similar to that of the first embodiment except that the front plane of SiC formed on the SiC substrate 12 is the Si-plane. However, in performing the process of depositing silicon containing B and oxidizing it, the plane direction dependency in oxidation of SiC may be considered. Approximately 700° C. is suitable for the C-plane, approximately 800° C. is suitable for the A-plane and the M-plane, and approximately 900° C. is suitable for the Si-plane.

The MOSFET 200 of the present embodiment includes the CsOB structure and the fixed dipole on the SiC side of the gate insulating film 28 in a similar manner to the MOSFET 100 of the first embodiment. Hence the band offset (ΔEc) increases, to further suppress a leakage current of the gate insulating film formed on the Si-plane. Moreover, with the CoCo structure not being on the SiC side of the gate insulating film 28, the carrier mobility is improved.

As a result of the above, ΔEc has increases by about 0.5 eV as compared to the initial value. In such a manner, gate leakage has hardly occurred even though it is a thin film of 46 nm. Furthermore, the mobility has increased, to be about 80 cm$^2$/Vs. Since there is no trap in the vicinity of the interface, the reliability has also been improved, and a threshold shift after the lapse of 1000 hours from application of ±20 V is smaller than 0.1 V.

In such a manner, there is obtained a MOSFET of SiC, which has: (1) excellent driving performance (film-thinning effect); (2) no gate leakage; (3) high mobility (effect of concentration of CsOB in the vicinity of the interface; and (4) high reliability. Further, it is similar to the first embodiment in that the insulation breakdown resistance in the JFET region interface has been improved.

Although the descriptions have been given taking the C-plane and the Si-plane of 4H—SiC as the examples in the above described embodiments, the effects of the CsOB structure and the fixed dipole are exerted in other plane directions such as the A-plane and the M-plane. Although the descriptions have been given by taking, as the example, the case where the silicon carbide crystalline structure is 4H—SiC, the embodiments can also be applied to silicon carbide having other crystalline structure such as 6H—SiC and 3C—SiC.

Although the descriptions have been given by taking, as the example, the vertical MOSFET where the gate insulating film and the gate electrode are formed on the top surface of SiC in the embodiments, the embodiments can also be applied to a vertical MOSFET where a gate insulating film and a gate electrode are formed on the inner surface of a trench formed on SIC.

Although the descriptions have been given by taking, as the example, the n-type transistor with electrons being carriers in the embodiments, it is also possible to apply the embodiments to a p-channel transistor with holes being carriers.

Further, it is also possible to apply the embodiments to other devices with a configuration where the gate insulating film and the gate electrode are formed on the surface of SiC, such as a vertical IGBT. In particular, in IGBT, enhancing the mobility by introducing nitrogen as shown in the second manufacturing method of the first embodiment has significant meaning. In the bipolar device, a current with a density not less than 100 times as large as that of a unipolar device is allowed to flow. Hence it is necessary to make the resistance in the MOS interface as low as possible. Here lies the most significant meaning of introduction of nitride (the most significant meaning of introduction of the oxynitride film). It is similar to the first embodiment in that the insulation breakdown resistance in the JFET region interface of the vertical IGBT has been improved. Since the vertical IGBT is desired to have higher insulation breakdown resistance as compared to that of the vertical MOSFET, it is highly effective to improve the insulation breakdown resistance in the JFET region interface.

While certain embodiments have been described, these embodiments have been presented by way of example only, and are not intended to limit the scope of the inventions. Indeed, the semiconductor device and the manufacturing method for the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
    a SiC layer;
    a gate insulating film provided on a surface of the SiC layer, the gate insulating film including an oxide film or an oxynitride film in contact with the surface of the SiC layer, the oxide film or the oxynitride film containing at least one element X selected from the group consisting of B (boron), Al (aluminum), Ga (gallium), In (indium), Sc (scandium), Y (yttrium), La (lanthanum), Mg (magnesium), Ca (calcium), Sr (strontium), and Ba (barium),
    a concentration peak of the element X in the gate insulating film being on the SiC layer side of the gate insulating film, the concentration peak of the element X being in the oxide film or the oxynitride film, the gate insulating film having a region with a concentration of the element X being not higher than $1\times10^{16}$ cm$^{-3}$ on the opposite side to the SiC layer with the concentration peak of the element; and
    a gate electrode provided on the gate insulating film, wherein
    a concentration of the element X at a portion of the SiC layer adjacent to the gate insulating film is not higher than $1\times10^{17}$ cm$^{-3}$,
    a concentration of the element X at the concentration peak of the element is not lower than $5\times10^{18}$ cm$^{-3}$ and not higher than $5\times10^{20}$ cm$^{-3}$,
    C (carbon) is contained in the gate insulating film,
    a concentration peak of C (carbon) in the gate insulating film is on the SiC side of the gate insulating film and is in the oxide film or the oxynitride film, and
    the concentration of the element X at the concentration peak of the element is not less than 80% and not more than 120% of the concentration of the C (carbon) at the concentration peak of the C (carbon).

2. The device according to claim 1, wherein the concentration peak of the element X is in a range of not more than 5 nm from an interface between the SiC layer and the gate insulating film.

3. The device according to claim 1, wherein
    the oxide film or the oxynitride film comprises a CsOX structure, which consists of C (carbon), the element X, and O (oxygen), and C (carbon) and the element X are bonded with an intervening O (oxygen) in between in the structure.

4. The device according to claim 1, wherein the concentration peak of the C (carbon) is in a range of not more than 5 nm from an interface between the SiC layer and the gate insulating film.

5. The device according to claim 1, wherein the gate insulating film is a stacked film of the oxide film or the oxynitride film and a film with a lower concentration of the element X than in the oxide film or the oxynitride film.

6. The device according to claim 5, wherein the film with a lower concentration of the element X than in the oxide film or the oxynitride film has a concentration of the element X of not higher than $1 \times 10^{16}$ cm$^{-3}$.

7. The device according to claim 1, wherein a concentration distribution of the element X in a film thickness direction and a concentration distribution of the C (carbon) in the film thickness direction agree with each other in a range of not less than 80% and not more than 120%.

8. The device according to claim 1, wherein a fixed dipole with a plus on the SiC layer side and a minus on the gate insulating film side exists between the SiC layer and the gate insulating film.

9. The device according to claim 1, wherein the oxide film or the oxynitride film is a silicon oxide film or a silicon oxynitride film.

10. A semiconductor device comprising:
a SiC substrate having first and second planes;
a first conductive type SiC layer formed on the first plane side of the SiC substrate;
a second conductive type first SiC region provided at a surface of the SiC layer;
a first conductive type second SiC region provided at a surface of the first SiC region;
a gate insulating film provided continuously on the surfaces of the SiC layer and the first SiC region, the gate insulating film including an oxide film or an oxynitride film in contact with the surface of the first SiC region, the oxide film or the oxynitride film containing at least one element X selected from the group consisting of B (boron), Al (aluminum), Ga (gallium), In (indium), Sc (scandium), Y (yttrium), La (lanthanum), Mg (magnesium), Ca (calcium), Sr (strontium), and Ba (barium), a concentration peak of the element X in the gate insulating film being on a side of the first SiC region of the gate insulating film, the concentration peak of the element X being in the oxide film or the oxynitride film, the gate insulating film having a region with a concentration of the element X of not higher than $1 \times 10^{16}$ cm$^{-3}$ on the opposite side to the SiC layer with the concentration peak of the element;
a gate electrode formed on the gate insulating film;
a first electrode formed on the second SiC region; and
a second electrode formed on the SiC substrate,
wherein
a concentration of the element X in the first SiC region is not higher than $1 \times 10^{17}$ cm$^{-3}$,
a concentration of the element X at the concentration peak of the element is not lower than $5 \times 10^{18}$ cm$^{-3}$ and not higher than $5 \times 10^{20}$ cm$^{-3}$,
C (carbon) is contained in the gate insulating film,
a concentration peak of C (carbon) in the gate insulating film is on the side of the first SiC region of the gate insulating film and is in the oxide film or the oxynitride film, and
the concentration of the element X at the concentration peak of the element is not less than 80% and not more than 120% of the concentration of the C (carbon) at the concentration peak of the C (carbon).

11. The device according to claim 10, wherein the concentration peak of the element X is in a range of not more than 5 nm from an interface between the first SiC region and the gate insulating film.

12. The device according to claim 10, wherein the concentration peak. of the C (carbon) is in a range of not more than 5 nm from an interface between the first SiC region and the gate insulating film.

13. The device according to claim 10, Wherein the SiC substrate is a first conductive type.

14. The device according to claim 10, wherein
the oxide film or the oxynitride film comprises a CsOX structure, which consists of C (carbon), the element X, and O (oxygen), and
C (carbon) and the element X are bonded with an intervening O (oxygen) in between in the structure.

* * * * *